US012813104B2

(12) United States Patent
Chung

(10) Patent No.: US 12,813,104 B2
(45) Date of Patent: Nov. 24, 2026

(54) DISPLAY DEVICE

(71) Applicant: Samsung Display Co., LTD., Yongin-si (KR)

(72) Inventor: Jae-Mo Chung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 317 days.

(21) Appl. No.: 18/405,109

(22) Filed: Jan. 5, 2024

(65) Prior Publication Data

US 2024/0306451 A1 Sep. 12, 2024

(30) Foreign Application Priority Data

Mar. 9, 2023 (KR) ........................ 10-2023-0031454

(51) Int. Cl.
*H10K 59/40* (2023.01)
*H10K 59/131* (2023.01)

(52) U.S. Cl.
CPC ........... *H10K 59/131* (2023.02); *H10K 59/40* (2023.02)

(58) Field of Classification Search
CPC .... H10K 59/40; H10K 59/131; G06F 3/0445; G06F 3/04164
See application file for complete search history.

(56) References Cited

U.S. PATENT DOCUMENTS

| | | | |
|---|---|---|---|
| 2020/0083306 A1 | 3/2020 | Choi et al. | |
| 2021/0083037 A1 | 3/2021 | Kim et al. | |
| 2021/0175292 A1 | 6/2021 | Bang et al. | |
| 2022/0107706 A1* | 4/2022 | Lu | G06F 3/0445 |

FOREIGN PATENT DOCUMENTS

| | | | |
|---|---|---|---|
| KR | 100553758 | B1 | 2/2006 |
| KR | 20200028567 | A | 3/2020 |
| KR | 20210033580 | A | 3/2021 |
| KR | 20210072198 | A | 6/2021 |
| KR | 1020220068302 | A | 5/2022 |
| KR | 1020220149879 | A | 11/2022 |

OTHER PUBLICATIONS

Korean Office Action with English Translation issued in KR 10-2023-0031454; Report Mailed Sep. 1, 2026; 19 pages.

* cited by examiner

*Primary Examiner* — Kevin M Nguyen
(74) *Attorney, Agent, or Firm* — CANTOR COLBURN LLP

(57) ABSTRACT

A display device includes a substrate including a display area, a first peripheral area surrounding the display area, a second peripheral area positioned in a first direction from the display area, and a bending area positioned between the first peripheral area and the second peripheral area, a first power line disposed in the second peripheral area on the substrate, where the first power line receives a first power voltage, a second power line disposed in the second peripheral area on the substrate, positioned farther from a center of the second peripheral area than the first power line, where the second power line receives a second power voltage, and a sensing layer disposed on the substrate, where sensing layer includes a touch electrode and a touch insulating layer contacting the first power line and the second power line in the second peripheral area.

19 Claims, 13 Drawing Sheets

DISPLAY DEVICE

This application claims priority to Korean Patent Application No. 10-2023-0031454, filed on Mar. 9, 2023, and all the benefits accruing therefrom under 35 U.S.C. § 119, the content of which in its entirety is herein incorporated by reference.

BACKGROUND

1. Field

The disclosure relates to a display device.

2. Description of the Related Art

A display device is a device that displays an image to provide visual information to a user. The display device may include a display area and a peripheral area.

A light emitting element emitting light and a transistor driving the light emitting element may be disposed in the display area. Drivers for generating signals and/or voltages may be disposed in the peripheral area. Lines connecting the drivers and the transistors to each other may be disposed in the peripheral area.

SUMMARY

Embodiments provide a display device with improved durability.

A display device according to an embodiment includes a substrate including a display area, a first peripheral area surrounding the display area, a second peripheral area positioned in a first direction from the display area, and a bending area positioned between the first peripheral area and the second peripheral area, a first power line disposed in the second peripheral area on the substrate, where the first power line receives a first power voltage, a second power line disposed in the second peripheral area on the substrate, and positioned farther from a center of the second peripheral area than the first power line, where the second power line receives a second power voltage, and a sensing layer disposed on the substrate, where the sensing layer includes a touch electrode and a touch insulating layer contacting the first power line and the second power line in the second peripheral area.

In an embodiment, the second peripheral area may include a first line contact area extending in a second direction perpendicular to the first direction in a plan view, where at least a portion of the first power line is disposed in the first line contact area, and a second line contact area spaced apart from the first line contact area in the plan view, and positioned farther from the center of the second peripheral area than the first line contact area, where at least a portion of the second power line is disposed in the second line contact area, and the touch insulating layer may contact the first power line in the first line contact area and contacts the second power line in the second line contact area.

In an embodiment, the second peripheral area may further include a third line contact area extending in the first direction in the plan view, and spaced apart from the first line contact area and the second line contact area, where at least a portion of the first power line or at least a portion of the second power line is disposed in the third line contact area, and the touch insulating layer may contact the first power line or the second power line in the third line contact area.

In an embodiment, the display device may further include a data driver disposed in the second peripheral area on the substrate, positioned in the first direction from the first line contact area, and positioned in the second direction from the third line contact area.

In an embodiment, the display device may further include an interlayer insulating layer disposed in the display area, the first peripheral area, the second peripheral area, and the bending area on the substrate, and disposed under the first power line and the second power line, and the touch insulating layer may further contact the interlayer insulating layer in the second peripheral area.

In an embodiment, the second peripheral area may further include an inorganic contact area spaced apart from the first line contact area and the second line contact area in the plan view, and spaced apart from the first line contact area with the second line contact area interposed therebetween, where at least a portion of the interlayer insulating layer is exposed from the first power line and the second power line in the inorganic contact area, and the touch insulating layer may contact the interlayer insulating layer in the inorganic contact area.

In an embodiment, the display device may further include an interlayer insulating layer disposed in the display area, the first peripheral area, the second peripheral area, and the bending area on the substrate, and disposed under the first power line and the second power line and a floating line disposed in the second peripheral area on the interlayer insulating layer, and positioned farther from the center of the second peripheral area than the second power line, where the floating line may include a same material as the second power line, and the touch insulating layer may further contact the floating line in the second peripheral area.

In an embodiment, the second peripheral area may further include a fourth line contact area spaced apart from the first line contact area and the second line contact area in the plan view, and spaced apart from the first line contact area with the second line contact area interposed therebetween, where at least a portion of the floating line is disposed in the fourth line, and the touch insulating layer may contact the floating line in the fourth line contact area.

In an embodiment, the first power line and the second power line may include a conductive material, and the touch insulating layer may include an inorganic material. In an embodiment, the first power voltage may have a higher potential than the second power voltage.

A display device according to an embodiment includes a substrate including a display area, a first peripheral area surrounding the display area, a second peripheral area positioned in a first direction from the display area, and a bending area positioned between the first peripheral area and the second peripheral area, a first power line disposed in the second peripheral area on the substrate, where the first power line receives a first power voltage, a second power line disposed in the second peripheral area on the substrate, and positioned farther from a center of the second peripheral area than the first power line, where the second power line receives a second power voltage, a third power line disposed in the second peripheral area on the substrate, and positioned closer to the center of the second peripheral area than the first power line, where the third power line receives the second power voltage, and a sensing layer disposed on the substrate, where the sensing layer includes a touch electrode and a touch insulating layer contacting the first power line, the second power line, and the third power line in the second peripheral area.

In an embodiment, the second peripheral area may include a first line contact area extending in a second direction perpendicular to the first direction in a plan view, where at least a portion of the first power line is disposed in the first line contact area, a second line contact area spaced apart from the first line contact area in the plan view, and positioned farther from the center of the second peripheral area than the first line contact area, where at least a portion of the second power line is disposed in the second line contact area, and a third line contact area positioned in the first direction from the first line contact area in a plan view, and extending in the second direction, where at least a portion of the third power line is disposed in the third line contact area, and the touch insulating layer may contact the first power line in the first line contact area, contacts the second power line in the second line contact area, and contacts the third power line in the third line contact area.

In an embodiment, the display device may further include a data driver disposed in the second peripheral area on the substrate and positioned in the first direction from the third line contact area, and the third line contact area may be positioned between the first line contact area and the data driver in the plan view.

In an embodiment, the second peripheral area may further include a fourth line contact area spaced apart from the first line contact area and the second line contact area in the plan view, and spaced apart from the second line contact area with the first line contact area interposed therebetween, where at least a portion of the third line is disposed in the fourth line contact area, and the touch insulating layer may contact the third power line in the fourth line contact area as well.

In an embodiment, the display device may further include an interlayer insulating layer disposed in the display area, the first peripheral area, the second peripheral area, and the bending area on the substrate, and disposed under the first power line and the second power line, and the touch insulating layer may further contact the interlayer insulating layer in the second peripheral area.

In an embodiment, the second peripheral area may further include an inorganic contact area spaced apart from the first line contact area and the second line contact area in the plan view, and spaced apart from the first line contact area with the second line contact area interposed therebetween, where at least a portion of the interlayer insulating layer is exposed from the first power line, the second power line, and the third power line in the inorganic contact area, and the touch insulating layer may contact the interlayer insulating layer in the inorganic contact area.

In an embodiment, the display device may further include an interlayer insulating layer disposed in the display area, the first peripheral area, the second peripheral area, and the bending area on the substrate, and disposed under the first power line and the second power line and a floating line disposed in the second peripheral area on the interlayer insulating layer, positioned farther from the center of the second peripheral area than the second power line, where the floating line may include a same material as the second power line, and the touch insulating layer may further contact the floating line in the second peripheral area.

In an embodiment, the second peripheral area may further include a fifth line contact area spaced apart from the first line contact area and the second line contact area in the plan view, and spaced apart from the first line contact area with the second line contact area interposed therebetween, where at least a portion of the floating line is disposed in the fifth line contact area, and the touch insulating layer may contact the floating line in the fifth line contact area.

In an embodiment, the first power line, the second power line, and the third power line may include a conductive material, and the touch insulating layer may include an inorganic material.

In an embodiment, the first power voltage may have a higher potential than the second power voltage.

In the display device according to embodiments, the display device may include power lines disposed in the peripheral area below the bending area and a touch insulating layer contacting the power lines in the peripheral area. That is, line contact areas, which are areas where the touch insulating layer contacts the power lines, may be defined in the peripheral area. Accordingly, a moisture barrier structure in which an inorganic layer and a conductive layer contact each other may be formed in the line contact areas. Accordingly, permeation of external air or moisture may be effectively delayed or effectively prevented by the moisture barrier structure. Accordingly, durability of the display device may be improved.

In such embodiments, since the moisture barrier structure is formed by contact between the power lines and the touch insulating layer, a size of each of the line contact areas may be wider, and a degree of freedom of a position of the moisture barrier structure may be improved. Accordingly, a position of each of the line contact areas where the moisture barrier structure is formed may be more various according to the embodiments. Accordingly, permeation of external air or moisture may be more effectively delayed or effectively prevented.

In such embodiments, compared to a case where the moisture barrier structure is formed by contact between the touch insulating layer and a structure under the power lines, the power lines may have a large size (e.g., planar area) even when the moisture barrier structure is formed. Accordingly, the moisture barrier structure may be formed without deteriorating a resistance characteristic of each of the power lines.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
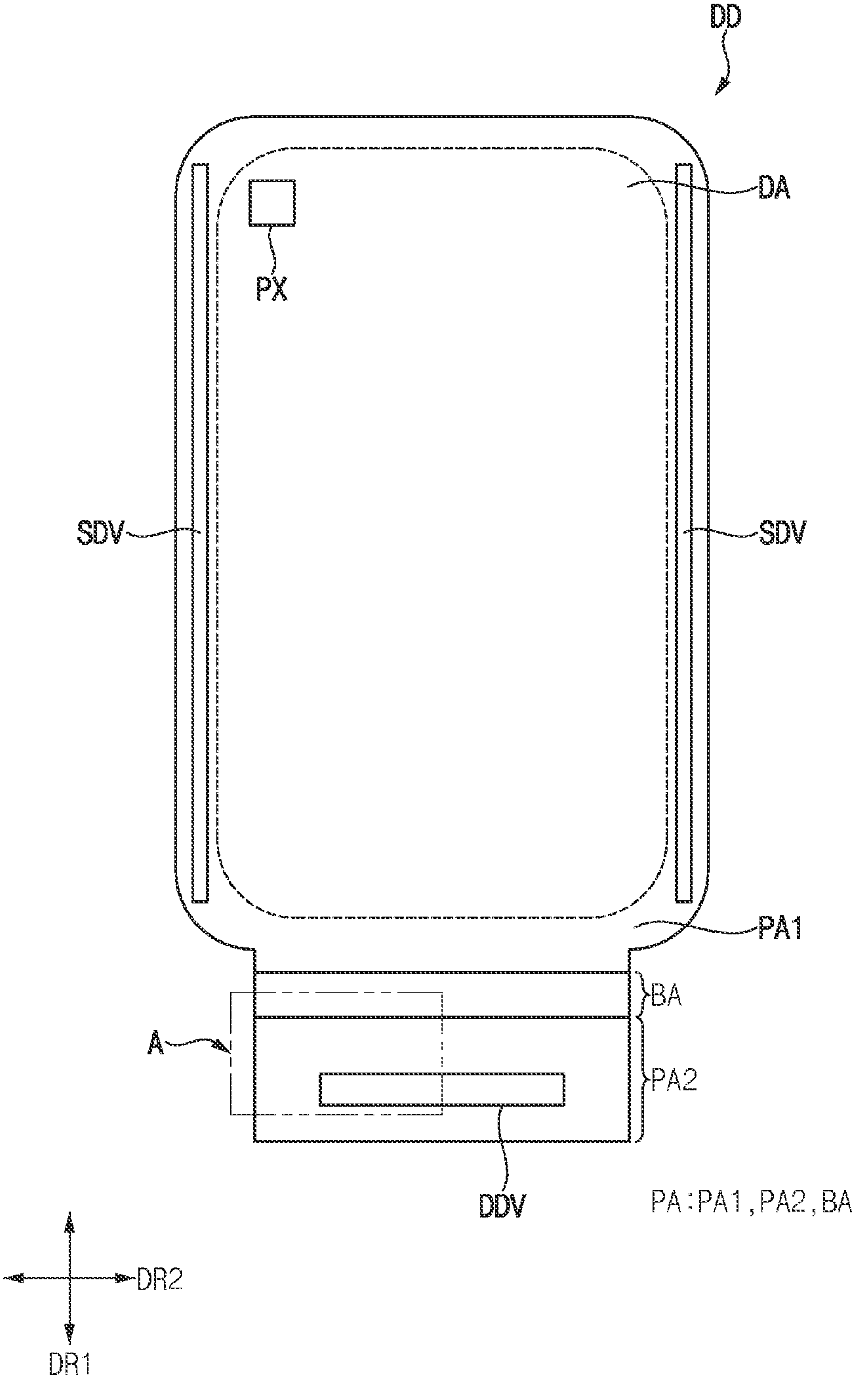
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a plan view illustrating a display device according to an embodiment.

Referring to FIG. 1, an embodiment of a display device DD (e.g., a substrate SUB of FIG. 4 and elements thereon) may be divided into a display area DA and a peripheral area PA. The display area DA may display an image, and the peripheral area PA may be positioned around the display area DA. In an embodiment, as shown in FIG. 1, the display area DA may have a rectangular shape on a plane defined by the first direction DR1 and the second direction DR2 perpendicular to the first direction DR1, and corners of the display area DA may be a round curve shape. However, the invention is not necessarily limited thereto.

At least one pixel PX may be disposed in the display area DA, and an image may be displayed through the pixel PX in the display area DA. The pixel PX may be generally disposed in the display area DA. In an embodiment, for example, the pixel PX may be arranged in a matrix form in the display area DA.

The peripheral area PA may include a first peripheral area PA1 surrounding the display area DA, a second peripheral area PA2 positioned in the first direction DR1 from the display area DA, and a bending area BA positioned between the first peripheral area PA1 and the second peripheral area PA2. The bending area BA may be a portion where the display device DD is folded.

A scan driver SDV may be disposed in the first peripheral area PA1. The scan driver SDV may be disposed on opposing sides of the display device DD. However, the invention is not necessarily limited thereto. The scan driver SDV may generate a scan signal based on a scan control signal. In an embodiment, for example, the scan signal may include a gate-on voltage for turning on a transistor and a gate-off voltage for turning off the transistor. The scan control signal may include a vertical start signal and a clock signal. That is, the scan driver SDV may output the scan signal based on the scan control signal, and the scan signal may be supplied to the pixel PX through a scan line.

A data driver DDV may be disposed in the second peripheral area PA2. The data driver DDV may be spaced apart from the display area DA with the bending area BA interposed therebetween. In other words, the data driver DDV may be positioned in the first direction DR1 from the bending area BA. That is, the data driver DDV may be positioned below the bending area BA. Since the data driver DDV is disposed in the second peripheral area PA2, when the bending area BA is folded, the data driver DDV may overlap the first peripheral area PA1 in a plan view.

The data driver DDV may generate a data signal based on a data control signal. The data control signal may include an output data enable signal, a horizontal start signal, and a load signal. That is, the data driver DDV may output the data signal according to the data control signal, and the data signal may be supplied to the pixel PX through the data line.

Figure 2:
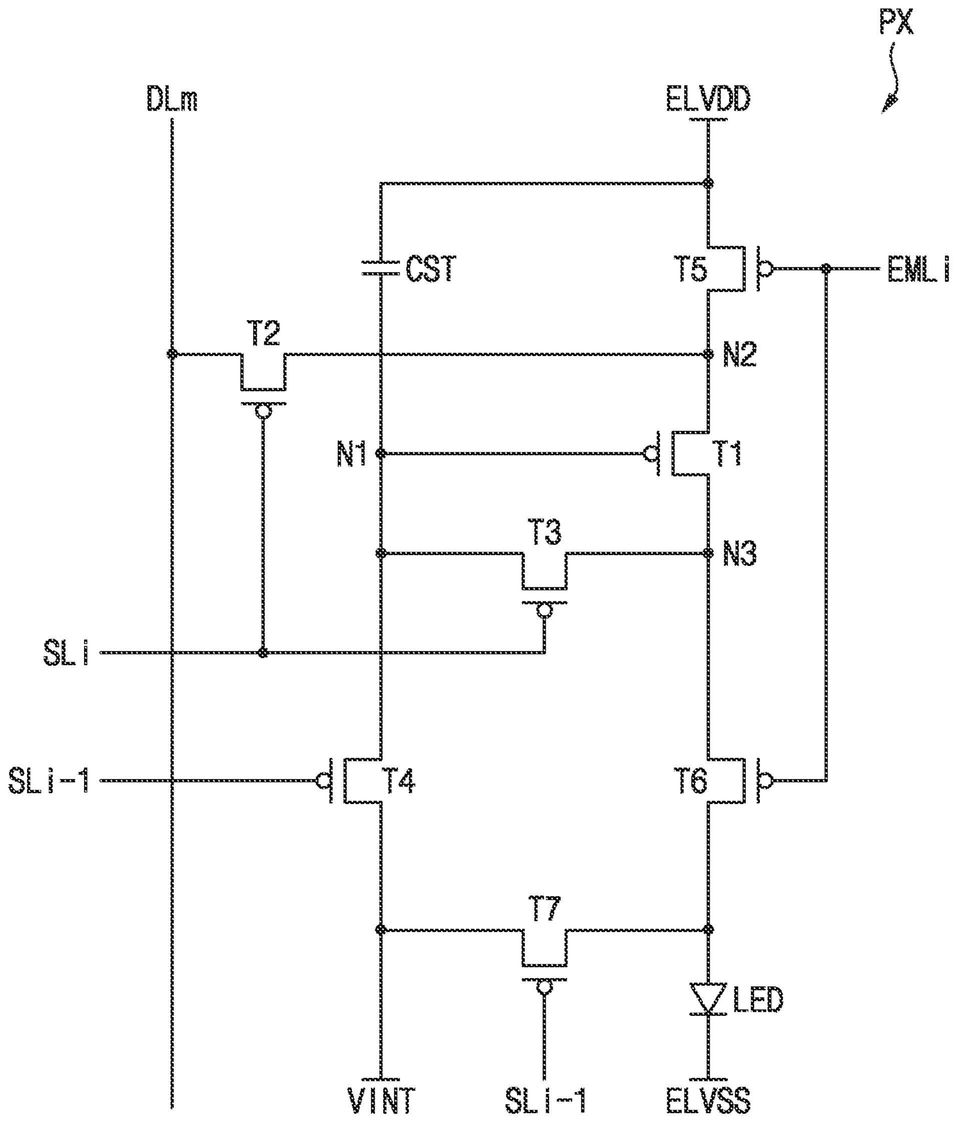
FIG. 2 is a circuit diagram illustrating an embodiment of a pixel included in the display device of FIG. 1.

FIG. 2 is a circuit diagram illustrating an embodiment of a pixel included in the display device of FIG. 1.

Referring to FIG. 2, an embodiment of the pixel PX may be connected to at least one scan line, at least one light emitting line, and at least one data line. A circuit structure of each of the pixels PX may be substantially the same as each other. Accordingly, for convenience of description, a pixel connected to a m-th data line DLm and the i-th scan line SLi will be described.

The pixel PX may include first to seventh transistors T1, T2, T3, T4, T5, T6, and T7, a storage capacitor CST, and a light emitting element LED.

The first transistor T1 may include a gate electrode connected to a first node N1, a first electrode connected to a second node N2, and a second electrode connected to a third node N3.

The second transistor T2 may include a gate electrode connected to the i-th scan line SLi, a first electrode connected to the m-th data line DLm, and a second electrode connected to the second node N2.

The third transistor T3 may include a gate electrode connected to the i-th scan line SLi, a first electrode connected to the first node N1, and a second electrode connected to the third node N3.

The fourth transistor T4 may include a gate electrode connected to an (i−1)-th scan line SLi−1, a first electrode to which an initialization signal VINT is applied, and a second electrode connected to the first node N1.

The fifth transistor T5 may include a gate electrode connected to a i-th emission control line EMLi, a first electrode to which a first power voltage ELVDD is applied, and a second electrode connected to the second node N2.

The sixth transistor T6 may include a gate electrode connected to the i-th light emitting control line EMLi, a first electrode connected to the third node N3, and a second electrode connected to a first electrode of the light emitting element LED.

The seventh transistor T7 may include a gate electrode connected to the (i−1)-th scan line SLi−1, a first electrode to which the initialization signal VINT is applied, and a first electrode connected to the first electrode of the light emitting element LED.

The storage capacitor CST may include a first electrode to which the first power voltage ELVDD is applied and a second electrode connected to the first node N1.

The light emitting element LED may include the first electrode and a second electrode to which the second power voltage ELVSS is applied.

In FIG. 2, an embodiment where the first to seventh transistors T1, T2, T3, T4, T5, T6, and T7 are p-channel metal oxide semiconductor (PMOS) transistors is illustrated as an example, but the invention is not necessarily limited thereto. In an alternative embodiment, for example, the third transistor T3 and the fourth transistor T4 may be n-channel metal oxide semiconductor (NMOS) transistors, and the other transistors may be PMOS transistors. In another alternative embodiment, for example, all of the first to seventh transistors T1, T2, T3, T4, T5, T6, and T7 may be NMOS transistors.

In addition, the number of transistors and capacitor shown in FIG. 2 is only an example and may be variously changed according to embodiments.

Figure 3:
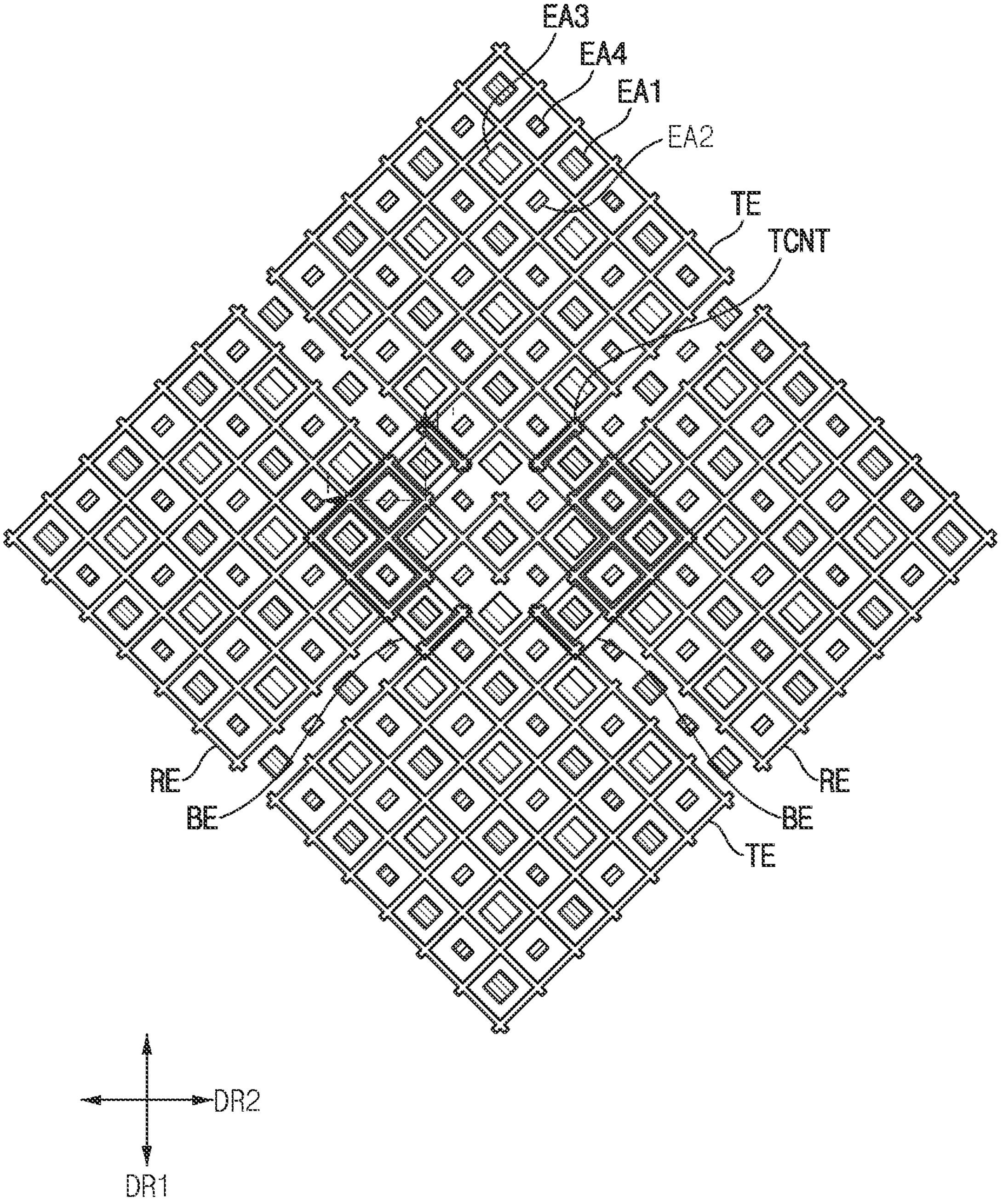
FIG. 3 is a plan view illustrating a display area of the display device of FIG. 1.

FIG. 3 is a plan view illustrating a display area of the display device of FIG. 1.

In FIG. 3, first to fourth light emitting parts EA1, EA2, EA3, and EA4, driving electrodes TE, and sensing electrodes RE of the display area DA of FIG. 1 are illustrated. In FIG. 3, an embodiment employing, as a touch driving method, a mutual capacitance method including two types of touch electrodes, that is, driving electrodes TE and sensing electrodes RE, to sense a user's touch, is shown. In FIG. 3, two of the sensing electrodes RE adjacent to each other in the second direction DR2 and two of the driving electrodes TE adjacent to each other in the first direction DR1 are illustrated for convenience of description.

Referring to FIG. 3, the driving electrodes TE and the sensing electrodes RE may be electrically separated from each other. In an embodiment, the driving electrodes TE and the sensing electrodes RE may be disposed or formed in (or directly on) a same layer as each other, and the driving electrodes TE and the sensing electrodes RE may be disposed apart from each other in a plan view.

The sensing electrodes RE may be electrically connected to each other in the second direction DR2. The driving electrodes TE may be electrically connected to each other in the first direction DR1. In order for the sensing electrodes RE and the driving electrodes TE to be electrically separated at intersections thereof, the driving electrodes TE adjacent to each other in the first direction DR1 may be connected through connection electrodes BE. The sensing electrodes RE may be connected to sensing lines, and the driving electrodes TE may be connected to the driving lines. The sensing lines and the driving lines may be collectively referred to as touch lines.

The connection electrodes BE may be disposed or formed in (or directly on) a different layer from the driving electrodes TE and the sensing electrodes RE, and may be connected to the driving electrodes TE through sensor contact holes TCNT. One end of each of the connection electrodes BE may be connected to one of the driving electrodes TE adjacent to each other in the first direction DR1 through the sensor contact holes TCNT. The other end of each of the connection electrodes BE may be connected to another one of the driving electrodes TE adjacent to each other in the first direction DR1 through the sensor contact holes TCNT. The connection electrodes BE may overlap at least one of the sensing electrodes RE in a plan view. Since the connection electrodes BE are disposed or formed in (or directly on) a different layer from the driving electrodes TE and the sensing electrodes RE, even if the connection electrodes BE overlap at least one of the sensing electrodes RE in a plan view, the connection electrodes BE may be electrically separated from the sensing electrodes RE.

A plurality of light emitting parts EA1, EA2, EA3, and EA4 for displaying an image may be disposed in the display area DA. Each of the plurality of light emitting parts EA1, EA2, EA3, and EA4 may be defined as an area where the light emitting element LED of FIG. 2 emits light.

In an embodiment, for example, first to fourth light emitting parts EA1, EA2, EA3, and EA4 may be disposed in the display area DA. In such an embodiment, the first light emitting part EA1 may indicate an area where a light emitting element (LED in FIG. 2) which emits a first light emits light, the second light emitting part EA2 may indicate an area which emits a second light emits light. In addition, the third light emitting part EA3 may indicate an area which emits a third light emits light, and the fourth light emitting part EA4 may indicate an area which emits a fourth light emits light. The pixel PX of FIG. 1 may be defined by grouping the first to fourth light emitting parts EA1, EA2, EA3, and EA4.

In an embodiment, the first light emitting part EA1, the second light emitting part EA2, the third light emitting part EA3, and the fourth light emitting part EA4 may emit different colors from each other. Alternatively, any two of the first light emitting part EA1, the second light emitting part EA2, the third light emitting part EA3, and the fourth light emitting part EA4 may emit light of a same color as each other. In an embodiment, for example, the first light emitting part EA1 may emit red light, the second light emitting part EA2 and the fourth light emitting part EA4 may emit green light, and the third light emitting part EA3 may emit blue light.

Each of the first light emitting part EA1, the second light emitting part EA2, the third light emitting part EA3, and the fourth light emitting part EA4 may have a rectangular planar shape like a rhombus, but the invention is not necessarily limited thereto. In an alternative embodiment, for example, the first light emitting part EA1, the second light emitting part EA2, the third light emitting part EA3, and the fourth light emitting part EA4 may have a polygonal other than a rectangular, circular, or elliptical planar shape.

In addition, although an embodiment where a size of the third light emitting part EA3 is the largest among the first light emitting part EA1, the second light emitting part EA2, the third light emitting part EA3, and the fourth light emitting part EA4, a size of the first light emitting part EA1 is the second largest, and a size of the second light emitting part EA2 and the fourth light emitting part EA4 are the smallest is illustrated in FIG. 3, the invention is not necessarily limited thereto.

Since the driving electrodes TE, the sensing electrodes RE, and the connection electrodes BE are formed in a mesh structure in a plan view, the light emitting parts EA1, EA2, EA3, and EA4 may not overlap the driving electrodes TE, the sensing electrodes RE, and the connection electrodes BE in a plan view. Therefore, reducing of luminance of the light emitted from the light emitting parts EA1, EA2, EA3, and EA4 by being blocked by the driving electrodes TE, the sensing electrodes RE, and the connection electrodes BE may be substantially reduced or effectively prevented.

Figure 4:
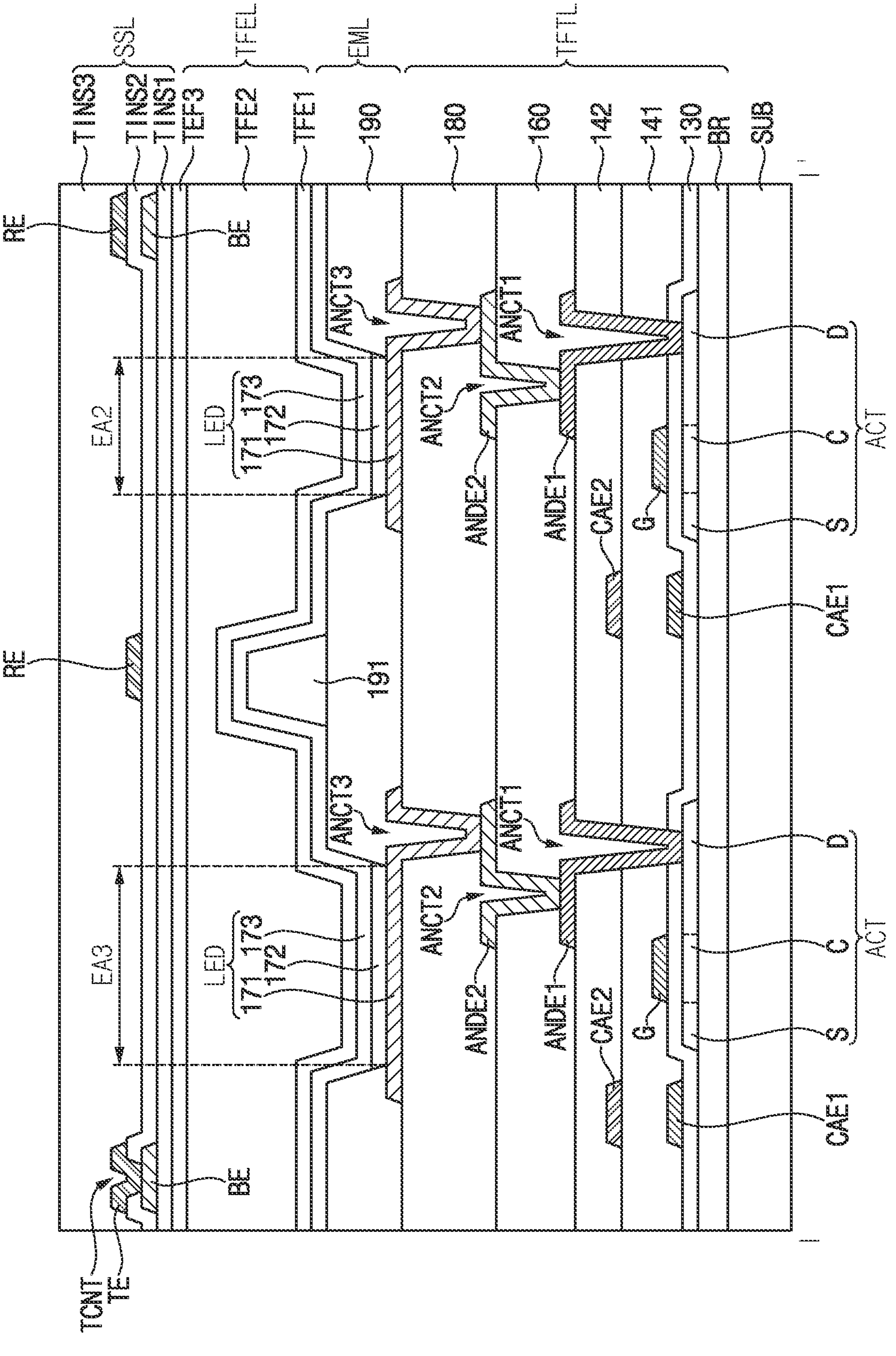
FIG. 4 is a cross-sectional view taken along line I-I' of FIG. 3.

FIG. 4 is a cross-sectional view taken along line I-I' of FIG. 3.

Referring to FIG. 4, an embodiment of the display device DD may include a substrate SUB, a transistor layer TFTL, a light emitting element layer EML, an encapsulation layer TFEL, and a sensing layer SSL.

The substrate SUB may include or be formed of an insulating material such as polymer resin or glass. In an embodiment, for example, the substrate SUB may include polyimide. In such an embodiment, the substrate SUB may be a flexible substrate capable of being bent, folded, or rolled.

The transistor layer TFTL may be disposed on the substrate SUB. The transistor layer TFTL may include an active layer ACT, a gate electrode G, a first capacitor electrode CAE1, a second capacitor electrode CAE2, a first anode connection electrode ANDE1, a second anode connection electrode ANDE2, a buffer layer BR, a gate insulating layer 130, a first interlayer insulating layer 141, a second interlayer insulating layer 142, a first planarization layer 160, and a second planarization layer 180.

The buffer layer BR may protect transistors of the transistor layer TFTL and an emission layer 172 of the light emitting element layer EML from moisture penetrating through the substrate SUB, which is vulnerable to moisture permeation. The buffer layer BR may include an inorganic material such as silicon nitride, silicon oxynitride, silicon oxide, titanium oxide, aluminum oxide, or the like.

The active layer ACT may be disposed on the buffer layer BR. The active layer ACT may include polycrystalline silicon, single crystal silicon, low temperature polycrystalline silicon, amorphous silicon, or an oxide semiconductor. The active layer ACT may include a channel region C, a source region S, and a drain region D. The channel region C may be a region overlapping the gate electrode G in a plan view. The source region S may be disposed on one side of the channel region C, and the drain region D may be disposed on an opposite side of the channel region C. The source region S and the drain region D may be regions that do not overlap the gate electrode G in a plan view. The source region S and the drain region D may be conductive regions obtained by doping a silicon semiconductor or an oxide semiconductor with ions or impurities. The gate insulating layer 130 may be disposed on the active layer ACT. The gate insulating layer 130 may include an inorganic material such as silicon nitride, silicon oxynitride, silicon oxide, titanium oxide, aluminum oxide, or the like.

The gate electrode G and the first capacitor electrode CAE1 may be disposed on the gate insulating layer 130. The gate electrode G may overlap the active layer ACT in a plan view. Although an embodiment where the gate electrode G and the first capacitor electrode CAE1 are separated from each other is illustrated in FIG. 4, in an alternative embodiment, for example, the gate electrode G and the first capacitor electrode CAE1 may be connected to each other. The gate electrode G and the first capacitor electrode CAE1 may include a metal, an alloy, a conductive metal oxide, a conductive metal nitride, a transparent conductive material, or the like.

The active layer ACT and the gate electrode G may form (or collectively define) a transistor. The transistor may correspond to any one of the first to seventh transistors T1, T2, T3, T4, T5, T6, and T7 described with reference to FIG. 2.

The first interlayer insulating layer 141 may be disposed on the gate electrode G and the first capacitor electrode CAE1. The first interlayer insulating layer 141 may include an inorganic material such as silicon nitride, silicon oxynitride, silicon oxide, titanium oxide, aluminum oxide, or the like.

The second capacitor electrode CAE2 may be disposed on the first interlayer insulating layer 141. The second capacitor electrode CAE2 may overlap the first capacitor electrode CAE1 in a plan view or in a thickness direction of the substrate SUB. The second capacitor electrode CAE2 may include a metal, an alloy, a conductive metal oxide, a conductive metal nitride, a transparent conductive material, or the like.

The first capacitor electrode CAE1 and the second capacitor electrode CAE2 may form a capacitor. The capacitor may correspond to the storage capacitor CST described with reference to FIG. 2.

The second interlayer insulating layer 142 may be disposed on the second capacitor electrode CAE2. The second interlayer insulating layer 142 may include an inorganic material such as silicon nitride, silicon oxynitride, silicon oxide, titanium oxide, aluminum oxide, or the like.

The first anode connection electrode ANDE1 may be disposed on the second interlayer insulating layer 142. The first anode connection electrode ANDE1 may be connected to the active layer ACT through the first connection contact hole ANCT1 defined in the gate insulating layer 130, the first interlayer insulating layer 141, and the second interlayer insulating layer 142. The first anode connection electrode ANDE1 may include a conductive material. In an embodiment, for example, the first anode connection electrode ANDE1 may include a metal, an alloy, a conductive metal oxide, a conductive metal nitride, a transparent conductive material, or the like.

The first planarization layer 160 may be disposed on the first anode connection electrode ANDE1. The first planarization layer 160 may be formed of organic materials such as photoresist, acrylic resin, epoxy resin, phenolic resin, polyamide resin, polyimide resin, or the like.

The second anode connection electrode ANDE2 may be disposed on the first planarization layer 160. The second anode connection electrode ANDE2 may be connected to the first anode connection electrode ANDE1 through the second connection contact hole ANCT2 defined in the first planarization layer 160. The second anode connection electrode ANDE2 may include a conductive material. In an embodiment, for example, the second anode connection electrode ANDE2 may include a metal, an alloy, a conductive metal oxide, a conductive metal nitride, a transparent conductive material, or the like.

The second planarization layer 180 may be disposed on the second anode connection electrode ANDE2. The second planarization layer 180 may include or be formed of organic materials such as photoresist, acrylic resin, epoxy resin, phenolic resin, polyamide resin, or polyimide resin, or the like.

The light emitting element layer EML may be disposed on the transistor layer TFTL. The light emitting element layer EML may include a pixel electrode 171, the emission layer 172, a common electrode 173, a pixel defining layer 190, and a spacer 191. The pixel electrode 171, the emission layer 172, and the common electrode 173 may form the light emitting element LED.

The pixel electrode 171 may be disposed on the second planarization layer 180. The pixel electrode 171 may be connected to the second anode connection electrode ANDE2 through a third connection contact hole ANCT3 defined in the second planarization layer 180. The pixel electrode 171 may include a metal, an alloy, a conductive metal oxide, a transparent conductive material, or the like.

The pixel defining layer 190 may be disposed on the second planarization layer 180. The pixel defining layer 190 may partially cover the pixel electrode 171 on the second planarization layer 180. The pixel defining layer 190 may have a pixel opening exposing at least a portion of an upper surface of the pixel electrode 171. The pixel defining layer 190 may include or be formed of organic materials such as photoresist, acrylic resin, epoxy resin, phenolic resin, polyamide resin, polyimide resin, or the like.

The emission layer 172 may be disposed on the pixel electrode 171. In an embodiment, for example, the emission layer 172 may be disposed on the pixel electrode 171 exposed from the pixel defining layer 190. In an embodiment, the emission layer 172 may have a multilayer structure including a hole injection layer, a hole transport layer, an organic emission layer, an electron transport layer, an electron injection layer, or the like.

The common electrode 173 may be disposed on the emission layer 172 and the pixel defining layer 190. The emission layer 172 may emit light based on a voltage difference between the pixel electrode 171 and the common electrode 173.

The spacer 191 may be disposed on the pixel defining layer 190. The spacer 191 may include organic materials such as photoresist, acrylic resin, epoxy resin, phenolic resin, polyamide resin, polyimide resin, or the like.

The encapsulation layer TFEL may be disposed on the light emitting element layer EML. The encapsulation layer TFEL may prevent oxygen and moisture from penetrating into the light emitting element layer EML and/or the transistor layer TFTL. The encapsulation layer TFEL may be disposed on the common electrode 173. The encapsulation layer TFEL may include at least one inorganic encapsulation layer and at least one organic encapsulation layer. In an embodiment, for example, the encapsulation layer TFEL may include a first inorganic encapsulation layer TFE1, an organic encapsulation layer TFE2, and a second inorganic encapsulation layer TFE3.

The first inorganic encapsulation layer TFE1 may be disposed on the common electrode 173, the organic encapsulation layer TFE2 may be disposed on the first inorganic encapsulation layer TFE1, and the second inorganic encapsulation layer TFE3 may be disposed on the organic encapsulation layer TFE2. The first inorganic encapsulation layer TFE1 and the second inorganic encapsulation layer TFE3 may include inorganic materials such as silicon nitride, silicon oxynitride, silicon oxide, titanium oxide, aluminum oxide, or the like. The organic encapsulation layer TFE2 may include organic materials such as acrylic resin, epoxy resin, phenolic resin, polyamide resin, polyimide resin, or the like.

The sensing layer SSL may be disposed on the encapsulation layer TFEL. The sensing layer SSL includes a first touch insulating layer TINS1, a connection electrode BE, a second touch insulating layer TINS2, a driving electrode TE, a sensing electrode RE, and a third touch insulating layer TINS3.

The first touch insulating layer TINS1 may be disposed on the encapsulation layer TFEL. The first touch insulating layer TINS1 may include an inorganic material such as silicon nitride, silicon oxynitride, silicon oxide, titanium oxide, aluminum oxide, or the like.

The connection electrode BE may be disposed on the first touch insulating layer TINS1. The connection electrode BE may include a metal, an alloy, a conductive metal oxide, a conductive metal nitride, a transparent conductive material, or the like.

The second touch insulating layer TINS2 may be disposed on the connection electrode BE. The second touch insulating layer TINS2 may include an inorganic material such as silicon nitride, silicon oxynitride, silicon oxide, titanium oxide, aluminum oxide, or the like.

The driving electrode TE and the sensing electrode RE may be disposed on the second touch insulating layer TINS2. The driving electrode TE and the sensing electrode RE may include a metal, an alloy, a conductive metal oxide, a conductive metal nitride, a transparent conductive material, or the like. The driving electrode TE and the sensing electrode RE may overlap the connection electrode BE in a plan view. The driving electrode TE may be connected to the connection electrode BE through the touch contact hole TCNT defined in the first touch insulating layer TINS1.

The third touch insulating layer TINS3 may be disposed on the driving electrode TE and the sensing electrode RE. The third touch insulating layer TINS3 may flatten a step formed by the driving electrode TE, the sensing electrode RE, and the connection electrode BE. The third touch insulating layer TINS3 may include or be formed of an organic material such as acrylic resin, epoxy resin, phenolic resin, polyamide resin, polyimide resin, or the like.

Figure 5:
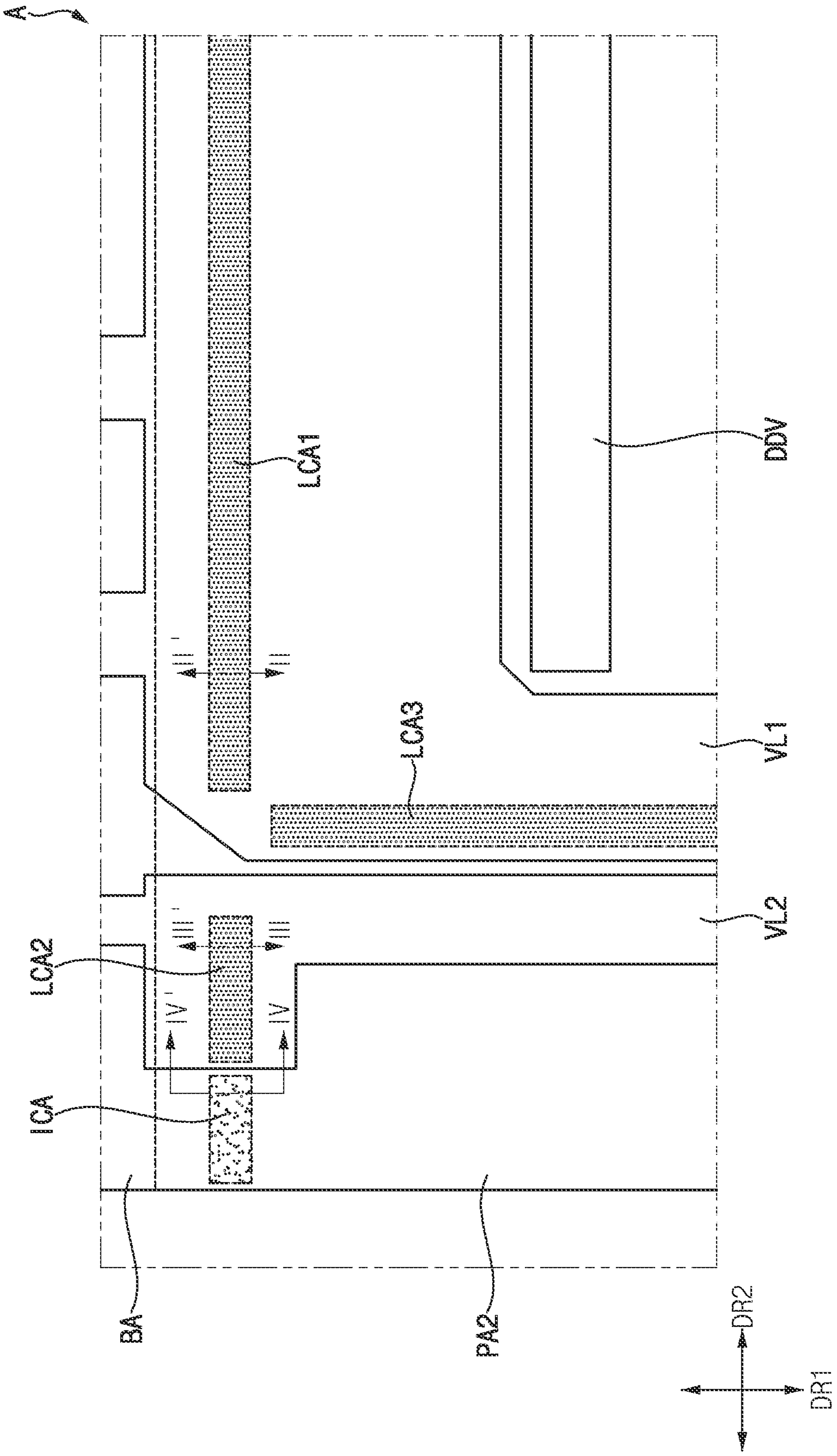
FIG. 5 is an enlarged view illustrating an embodiment of area A of FIG. 1.

FIG. 5 is an enlarged view illustrating an embodiment of area A of FIG. 1.

In FIG. 5, only a left portion of each of the bending area BA and the second peripheral area PA2 are illustrated based on an imaginary reference line that passes through a center of the display device DD and extends in the first direction DR1. Based on the reference line, a right portion of each or the bending area BA and the second peripheral area PA2 may have a planar structure symmetrical with the left portion. Therefore, hereinafter, the structure of the display device DD will be described focusing on the left portion of each of the bending area BA and the second peripheral area PA2 based on the reference line.

Referring to FIGS. 1 and 5, an embodiment of the display device DD may include a first power line VL1 and a second power line VL2. The first power line VL1 and the second power line VL2 may be disposed in the second peripheral area PA2. The first power line VL1 and the second power line VL2 may also be disposed in the bending area BA. In an embodiment, each of the first power line VL1 and the second power line VL2 may be connected to a power line disposed in the first peripheral area PA1 through power connection lines (not shown) disposed in the bending area BA. In such an embodiment, the power lines disposed in the first peripheral area PA1 may be connected to driving power lines extending into the display area DA. The driving power lines may provide a power voltage to the pixel (PX in FIG. 1). That is, the first power line VL1 and the second power line VL2 may provide the power voltage to the pixel PX.

In an embodiment, the first power voltage ELVDD may be supplied (provided or applied) to the first power line VL1. Accordingly, the first power line VL1 may provide the first power voltage ELVDD to the pixel PX. The second power voltage ELVSS may be supplied to the second power line VL2. Accordingly, the second power line VL2 may provide the second power voltage ELVSS to the pixel PX. In an embodiment, for example, the second power line VL2 may provide the second power voltage ELVSS to the common electrode (173 in FIG. 4). In an embodiment, the first power voltage ELVDD may have a higher potential (or voltage level) than the second power voltage ELVSS.

In an embodiment, the second power line VL2 may be positioned farther from a center of the second peripheral area PA2 than the first power line VL1. In an embodiment, for example, the second power line VL2 may be positioned farther from the data driver DDV than the first power line VL1. In such an embodiment, the first power line VL1 may be positioned closer to the data driver DDV than the second power line VL2.

Figure 6:
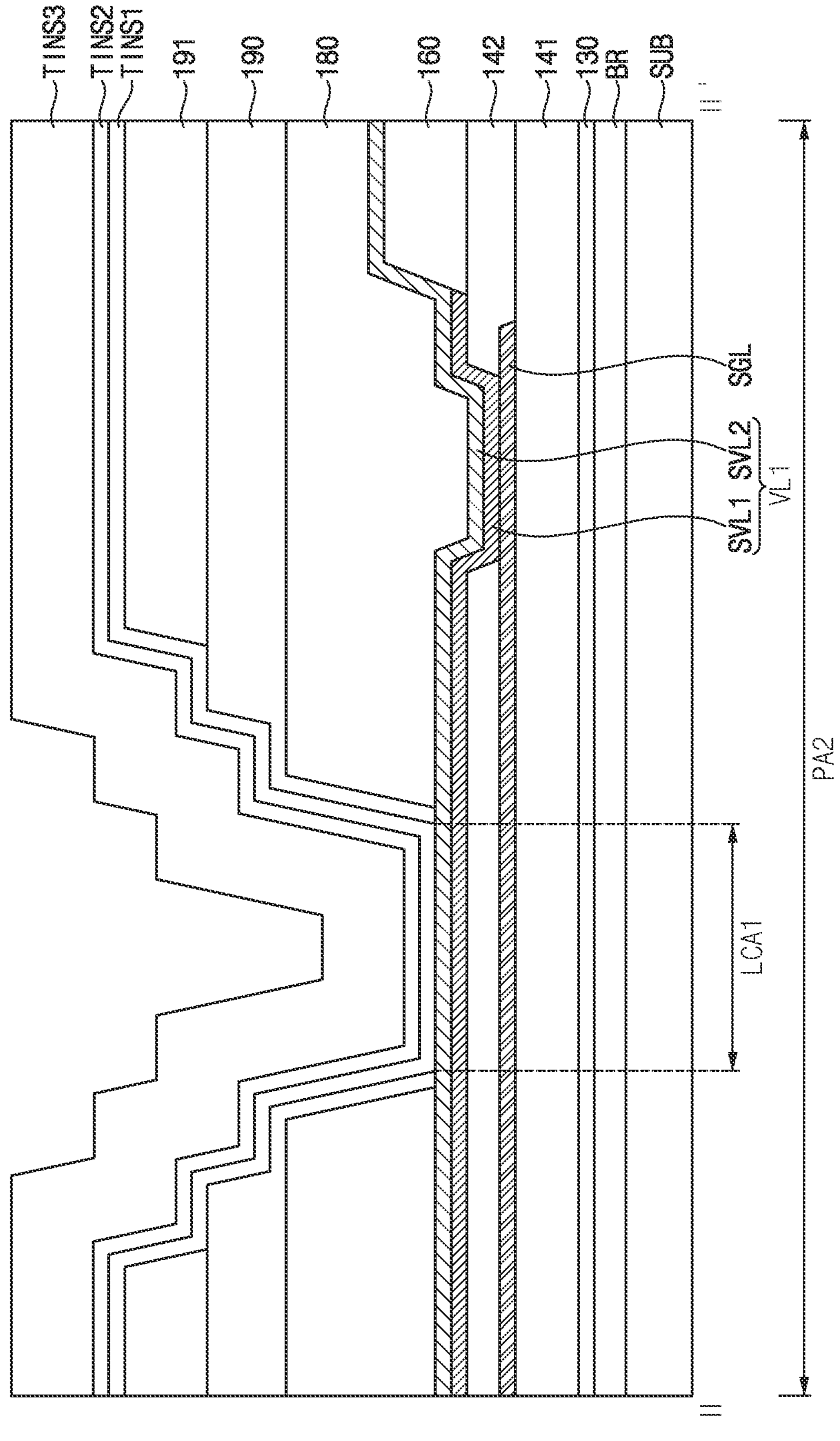
FIG. 6 is a cross-sectional view taken along line II-II of FIG. 5.
Figure 7:
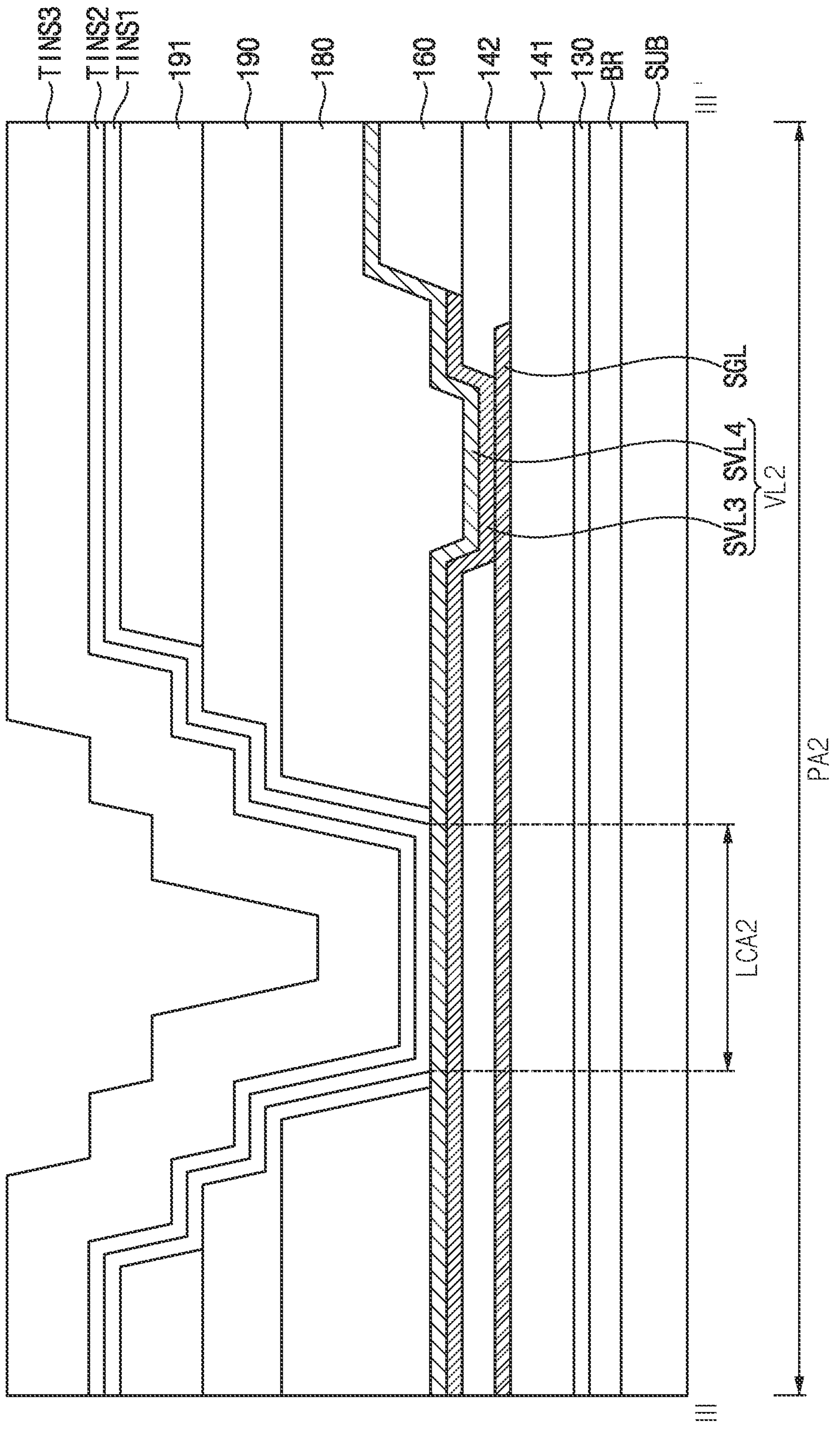
FIG. 7 is a cross-sectional view taken along line III-III' of FIG. 5.

FIG. 6 is a cross-sectional view taken along line II-II' of FIG. 5, and FIG. 7 is a cross-sectional view taken along line III-III' of FIG. 5.

Referring to FIGS. 6 and 7, the buffer layer BR, the gate insulating layer 130, the first interlayer insulating layer 141, and the second interlayer insulating layer 142, a signal line SGL, the first power line VL1, the second power line VL2, the first planarization layer 160, the second planarization layer 180, the pixel defining layer 190, the spacer 191, the first touch insulating layer TINS1, the second touch insulating layer TINS2, and the third touch insulating layer TINS3 may be disposed in the second peripheral area PA2 on the substrate SUB. Hereinafter, for convenience of descriptions, any repetitive detailed description of components the same as the components described above with reference to FIG. 4 will be omitted.

In an embodiment, the signal line SGL may be disposed on the first interlayer insulating layer 141. In an embodiment, for example, the signal line SGL may include or be formed of a same material as the second capacitor electrode (CAE2 in FIG. 4) and disposed in (or directly on) a same layer as the second capacitor electrode CAE. However, the invention is not necessarily limited thereto, and in an alternative embodiment, for another example, the signal line SGL may be disposed on the gate insulating layer 130. That is, the signal line SGL may include or be formed of a same material as the gate electrode (G of FIG. 4) and the first capacitor electrode (CAE1 of FIG. 4) and disposed in (or directly on) a same layer as the gate electrode G and the first capacitor electrode CAE1. The signal line SGL may include a metal, an alloy, a conductive metal oxide, a conductive metal nitride, a transparent conductive material, or the like. The first power line VL1 and the second power line VL2 may be electrically connected to the signal line SGL.

In an embodiment, as shown in FIG. 6, the first power line VSL1 may include a first sub power line SVL1 and a second sub power line SVL2.

The first sub power line SVL1 may be disposed on the second interlayer insulating layer 142. That is, the first sub power line SVL1 may include or be formed of a same material as the first anode connection electrode (ANDE1 in FIG. 4) and disposed in (or directly on) the same layer as the first anode connection electrode ANDE1. In an embodiment, for example, the first sub power line SVL1 may include a conductive material such as metal, alloy, conductive metal oxide, conductive metal nitride, transparent conductive material, or the like.

The second sub power line SVL2 may be disposed on the first sub power line SVL1 and the first planarization layer 160. That is. the second sub power line SVL2 may include or be formed of a same material as the second anode connection electrode (ANDE2 in FIG. 4) and may be disposed in (or directly on) a same layer as the second anode connection electrode ANDE2. In an embodiment, for example, the second sub power line SVL2 may include a conductive material such as metal, alloy, conductive metal oxide, conductive metal nitride, transparent conductive material, or the like.

In an embodiment, as shown in FIG. 7, the second power line VL2 may include a third sub power line SVL3 and a fourth sub power line SVL4.

The third sub power line SVL3 may be disposed on the second interlayer insulating layer 142. That is, the third sub power line SVL3 may include or be formed of a same material as the first anode connection electrode (ANDE1 in FIG. 4) and the first sub power line SVL1 and disposed in (or directly on) the same layer as the first anode connection electrode ANDE1 and the first sub power line SVL1. In an embodiment, for example, the third sub power line SVL3 may include a conductive material such as metal, alloy, conductive metal oxide, conductive metal nitride, transparent conductive material, or the like.

The fourth sub power line SVL4 may be disposed on the third sub power line SVL3 and the first planarization layer 160. That is. The fourth sub power line SVL4 may be formed of a same material as the second anode connection electrode (ANDE2 in FIG. 4) and the second sub power line SVL2 and may be disposed in (or directly on) a same layer as the second anode connection electrode ANDE2 and the second sub power line SVL2. In an embodiment, for example, the fourth sub power line SVL4 may include a conductive material such as metal, alloy, conductive metal oxide, conductive metal nitride, transparent conductive material, or the like.

The first touch insulating layer TINS1 may be disposed directly on the pixel defining layer 190 and the spacer 191 in the second peripheral area PA2. That is, the encapsulation layer TFEL may not be disposed in the second peripheral area PA2. In addition, the second touch insulating layer TINS2 may be disposed on the first touch insulating layer TINS1 in the second peripheral area PA2, and the third touch insulating layer TINS3 may be disposed on the second touch insulating layer TINS2 in the second peripheral area PA2.

In an embodiment, as shown in FIGS. 6 and 7, in the second peripheral area PA2, the second planarization layer 180, the pixel defining layer 190, and the spacer 191 may expose a portion of each of the first power line VL1 and the second power line VL2.

Accordingly, the first touch insulating layer TINS1 may contact the first power line VL1 and the second power line VL2 exposed from the second planarization layer 180, the pixel defining layer 190, and the spacer 191. Accordingly, a moisture barrier structure in which an inorganic layer and a conductive layer contact each other may be formed in the second peripheral area PA2. Permeation of external air or moisture may be effectively delayed or effectively prevented by the moisture barrier structure. Accordingly, durability of the display device DD may be further improved.

In an embodiment, the moisture barrier structure may be formed in the line contact areas LCA1, LCA2, and LCA3 in the second peripheral area PA2. That is, the second peripheral area PA2 may include at least one line contact area. Hereinafter, the line contact area refers to an area where a line including a conductive material and the first touch insulating layer TINS1 contacts in the second peripheral area PA2.

In an embodiment, as shown in FIG. 5, the second peripheral area PA2 may include a first line contact area LCA1, a second line contact area LCA2, and a third line contact area LCA3.

The first line contact area LCA1 may extend in the second direction DR2 in a plan view. A portion of the first power line VL1 may be disposed in the first line contact area LCA1. That is, as shown in FIG. 6, the first touch insulating layer TINS1 may contact the first power line VL1 in the first line contact area LCA1.

The second line contact area LCA2 may be spaced apart from the first line contact area LCA1 in a plan view. In an embodiment, the second line contact area LCA2 may be positioned farther from the center of the second peripheral area PA2 than the first line contact area LCA1. In an embodiment, for example, the second line contact area LCA2 may be positioned farther from the data driver DDV than the first line contact area LCA1. In other words, the first line contact area LCA1 may be positioned closer to the data driver DDV than the second line contact area LCA2.

A portion of the second power line VL2 may be disposed in the second line contact area LCA2. In an embodiment, as shown in FIG. 7, the first touch insulating layer TINS1 may contact the second power line VL2 in the second line contact area LCA2.

The third line contact area LCA3 may be spaced apart from the first line contact area LCA1 and the second line contact area LCA2. In an embodiment, for example, the third line contact area LCA3 may be positioned in the first direction DR1 from the first line contact area LCA1 and the second line contact area LCA2. That is, the third line contact area LCA3 may be positioned below the first line contact area LCA1 and the second line contact area LCA2. In an embodiment, a portion of the first power line VL1 may be disposed in the third line contact area LCA3. That is, although not shown, the first touch insulating layer TINS1 may contact the first power line VL1 in the third line contact area LCA3 as well.

The third line contact area LCA3 may extend in the first direction DR1 in a plan view. That is, a direction in which the third line contact area LCA3 extends and a direction in which the first line contact area LCA1 extends may be perpendicular to each other. Accordingly, air or moisture introduced from outside in various directions may be more effectively blocked. In an embodiment, for example, air or moisture introduced in the first direction DR1 may be blocked by a moisture barrier structure formed in the first and second line contact areas LCA1 and LCA2, and may be blocked in the second direction, and air or moisture introduced in the second direction DR2 may be blocked by a moisture barrier structure formed in the third line contact area LCA3. Accordingly, durability of the display device DD may be further improved.

According to embodiments, the first touch insulating layer TINS1 may contact the power lines VL1 and VL2 in the second peripheral area PA2. That is, the line contact areas LCA1, LCA2, and LCA3, which are areas in which the first touch insulating layer TINS1 contacts the power lines VL1 and VL2, may be defined in the second peripheral area PA2. Accordingly, a moisture barrier structure in which an inorganic layer and a conductive layer contact each other may be formed or defined in the line contact areas LCA1, LCA2, and LCA3. Accordingly, permeation of external air or moisture may be effectively delayed or effectively prevented by the moisture barrier structure. Accordingly, durability of the display device DD may be improved.

In such embodiments, since the moisture barrier structure is formed by contact between the first touch insulating layer TINS1 and the power lines VL1 and VL2, a size of the line contact areas LCA1, LCA2 and LCA3 may be wider, and a degree of freedom of a position of the moisture barrier structure may be improved. Accordingly, a position of each of the line contact areas where the moisture barrier structure is formed may be more various according to the embodiments. Accordingly, permeation of external air or moisture may be more effectively delayed or effectively prevented.

In addition, according to embodiments, compared to a case where the moisture barrier structure is formed by contact between the first touch insulating layer TINS1 and a structure under the power lines VL1 and VL2, the power lines VL1 and VL2 may have a large size (e.g., planar area) even when the moisture barrier structure is formed. Accordingly, the moisture barrier structure may be provided or formed without deteriorating a resistance characteristic of each of the power lines VL1 and VL2.

Figure 8:
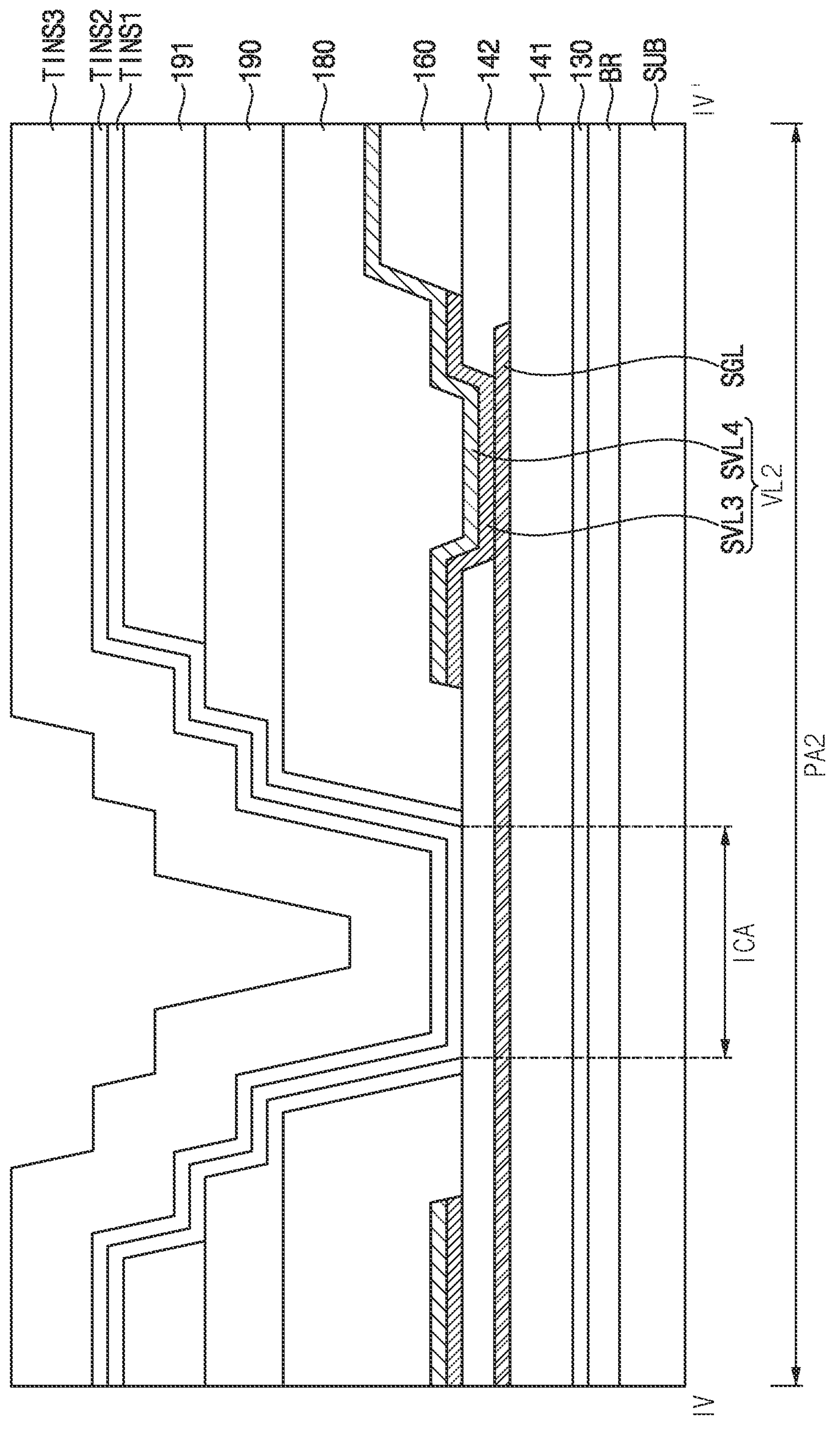
FIG. 8 is a cross-sectional view taken along line IV-IV of FIG. 5.

FIG. 8 is a cross-sectional view taken along line IV-IV of FIG. 5.

Referring to FIGS. 5 and 8, the second peripheral area PA2 may further include an inorganic contact area ICA. Hereinafter, the inorganic contact area ICA refers to an area where the second interlayer insulating layer 142 and the first touch insulating layer TINS1 contacts in the second peripheral area PA2.

The inorganic contact area ICA may be spaced apart from the first and second line contact areas LCA1 and LCA2 in a plan view. In an embodiment, the inorganic contact area ICA may be spaced apart from the first line contact area LCA1 with the second line contact area LCA2 interposed therebetween. That is, the inorganic contact area ICA may be positioned farther from the center of the second peripheral area PA2 than the first and second line contact areas LCA1 and LCA2. In an embodiment, for example, the inorganic contact area ICA may be positioned farther from the data driver DDV than the first and second line contact areas LCA1 and LCA2. In other words, the inorganic contact area ICA may be positioned closer to the data driver DDV than the first and second line contact areas LCA1 and LCA2.

A portion of the second interlayer insulating layer 142 may be disposed in the inorganic contact area ICA. In addition, the first power line VL1 and the second power line VL2 may not be disposed in the inorganic contact area ICA. In other words, in the inorganic contact area ICA, a portion of the second interlayer insulating layer 142 may be exposed from the first and second power lines VL1 and VL2. That is, as shown in FIG. 8, the first touch insulating layer TINS1 may contact the second interlayer insulating layer 142 in the inorganic contact area ICA.

Accordingly, a moisture barrier structure in which one inorganic layer contacts another inorganic layer may also be formed in the second peripheral area PA2. In an embodiment, the moisture barrier structure may be formed in the inorganic contact area ICA. Permeation of external air or moisture may also be effectively delayed or effectively prevented by the moisture barrier structure in which one inorganic layer contacts another inorganic layer. Accordingly, durability of the display device DD may be further improved.

Figure 9:
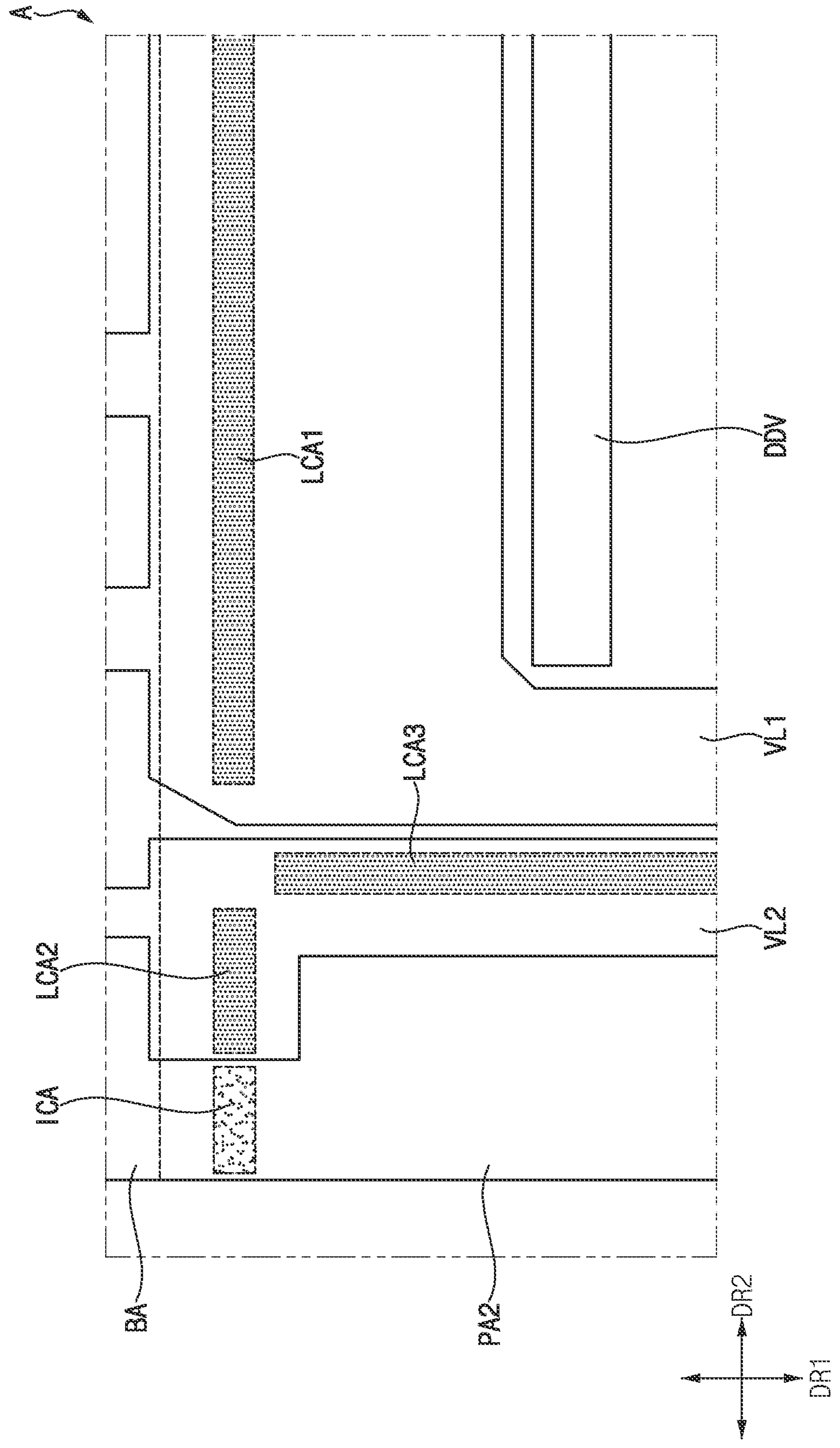
FIG. 9 is an enlarged view illustrating an alternative embodiment of area A of FIG. 1.

FIG. 9 is an enlarged view illustrating an alternative embodiment of area A of FIG. 1.

Referring to FIG. 9, in an embodiment, a portion of the second power line VL2 may be disposed in the third line contact area LCA3. In such an embodiment, although not shown, the first touch insulating layer (TINS1 in FIGS. 6 to 8) may contact the second power line VL2 in the third line contact area LCA3 as well. That is, according to a size (e.g., a planar area) of each of the first power line VL1 and the second power line VL2, the third line contact area LCA3 extending in the first direction DR1 may be defined by a contact between the first touch insulating layer TINS1 and the second power line VL2. In other words, in an embodiment, the first touch insulating layer TINS1 may contact the second power line VL2 in the first and third line contact areas LCA1 and LCA3.

Figure 10:
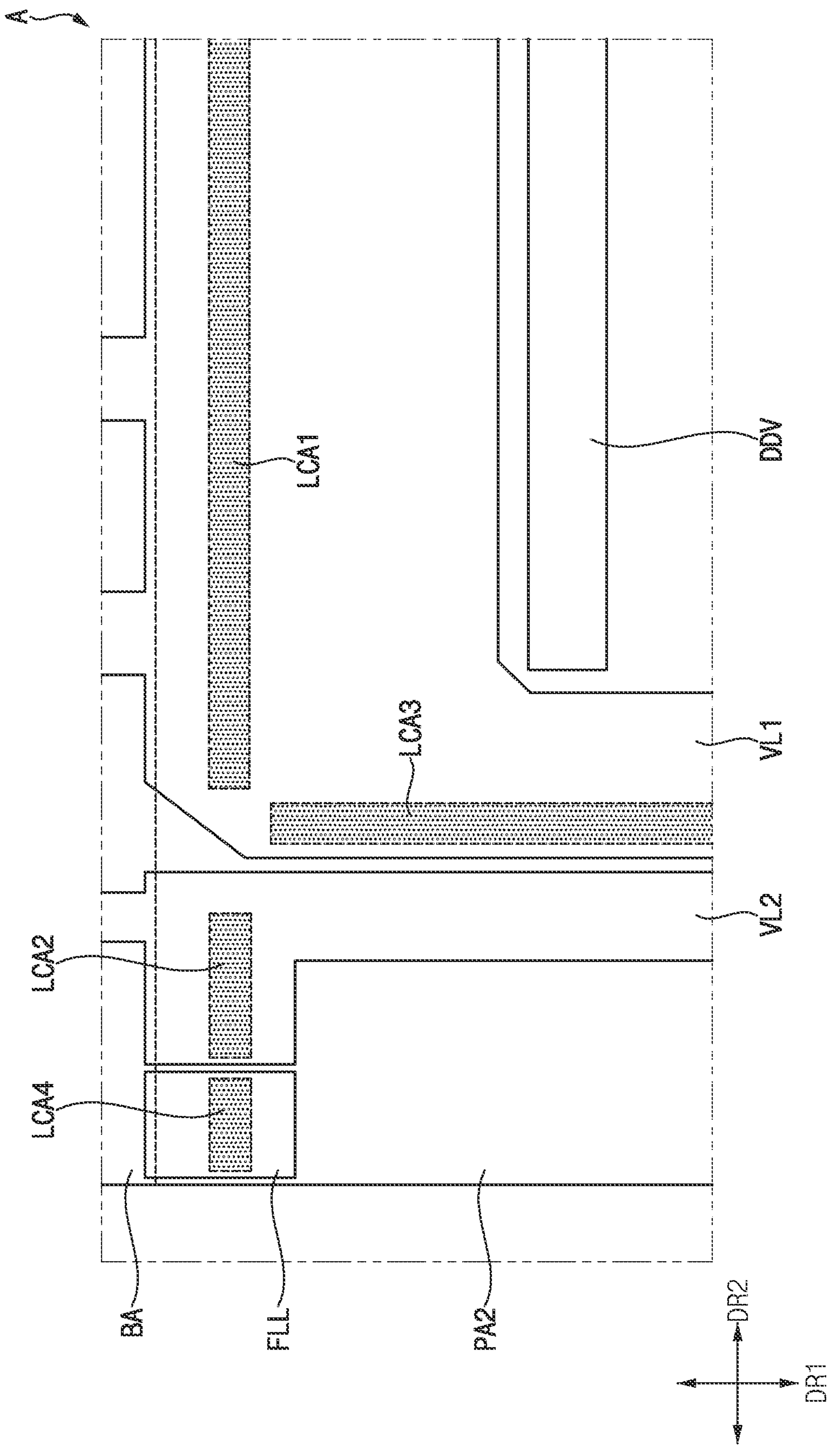
FIG. 10 is an enlarged view illustrating another alternative embodiment of area A of FIG. 1.

FIG. 10 is an enlarged view illustrating another alternative embodiment of area A of FIG. 1.

Referring to FIGS. 1 and 10, an embodiment of the display device DD may further include a floating line FLL. The floating line FLL may be disposed in the second peripheral area PA2. In an embodiment, the floating line FLL may be positioned farther from the center of the second peripheral area PA2 than the second power line VL2. In an embodiment, for example, the floating line FLL may be positioned farther from the data driver DDV than the second power line VL2. In other words, the second power line VL2 may be positioned closer to the data driver DDV than the floating line FLL.

In an embodiment, the floating line FLL may include or be formed of a same material as the second power line VL2 and may be disposed in (or directly on) a same layer as the second power line VL2. In an embodiment, for example, the floating line FLL may include a conductive material such as metal, alloy, conductive metal oxide, conductive metal nitride, transparent conductive material, or the like. In an embodiment, the floating line FLL may have a structure in which two sub lines are stacked.

Since the display device DD further includes the floating line FLL, damage to structures under the floating line FLL due to external pressure or the like may be effectively reduced or effectively prevented. Accordingly, durability of the display device DD may be further improved.

In an embodiment, the second peripheral area PA2 may further include a fourth line contact area LCA4.

The fourth line contact area LCA4 may be spaced apart from the first line contact area LCA1 and the second line contact area LCA2 in a plan view. In an embodiment, the fourth line contact area LCA4 may be spaced apart from the first line contact area LCA1 with the second line contact area LCA2 interposed therebetween. That is, the fourth line contact area LCA4 may be positioned farther from the center of the second peripheral area PA2 than the first line contact area LCA1 and the second line contact area LCA2. In an embodiment, for example, the fourth line contact area LCA2 may be positioned farther from the data driver DDV than the first line contact area LCA1 and the second line contact area LCA2. In other words, the fourth line contact area LCA4 may be positioned closer to the data driver DDV than the first line contact area LCA1 and the second line contact area LCA2.

A portion of the floating line FLL may be disposed in the fourth line contact area LCA4. in an embodiment, although not shown, the first touch insulating layer (TINS1 of FIGS. 6 to 8) may contact the floating line FLL in the fourth line contact area LCA4. Accordingly, a moisture barrier structure in which an inorganic layer and a conductive layer contact each other may be formed in the fourth line contact area LCA4 as well. Accordingly, permeation of external air or moisture may be more effectively delayed or effectively prevented. Accordingly, durability of the display device DD may be further improved.

Figure 11:
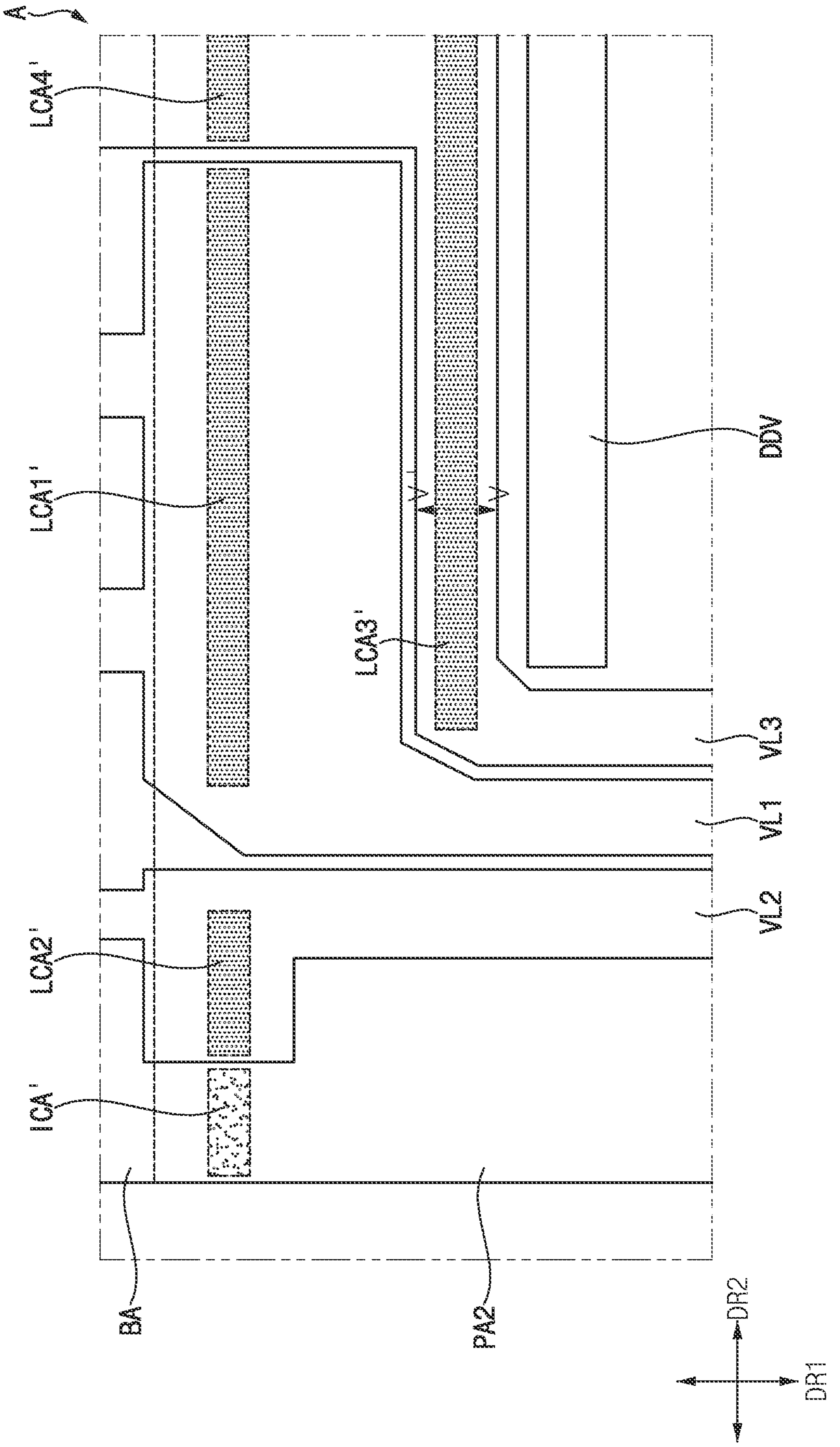
FIG. 11 is an enlarged view illustrating still another alternative embodiment of area A of FIG. 1.

FIG. 11 is an enlarged view illustrating still another alternative embodiment of area A of FIG. 1.

Referring to FIGS. 1 and 11, an embodiment of the display device may further include a third power line VL3. The third power line VL3 may be disposed in the second peripheral area PA2. The third power line VL3 may also be disposed in the bending area BA. In an embodiment, the third power line VL3 may be connected to the power line disposed in the first peripheral area PA1 through power connection lines (not shown) disposed in the bending area BA. Also, the power lines disposed in the first peripheral area PA1 may be connected to driving power lines extending into the display area DA. The driving power lines may provide a power voltage to the pixel (PX in FIG. 1). That is, the third power line VL3 may provide a power voltage to the pixel PX.

In an embodiment, the second power voltage ELVSS may be supplied to the third power line VL3. Accordingly, the third power line VL3 may provide the second power voltage ELVSS to the pixel PX. In an embodiment, for example, the third power line VL3 may provide the second power voltage ELVSS to the common electrode (173 in FIG. 4).

In an embodiment, the third power line VL3 may be positioned closer to the center of the second peripheral area PA2 than the first power line VL1. In an embodiment, for example, the third power line VL3 may be positioned closer to the data driver DDV than the first power line VL1.

Figure 12:
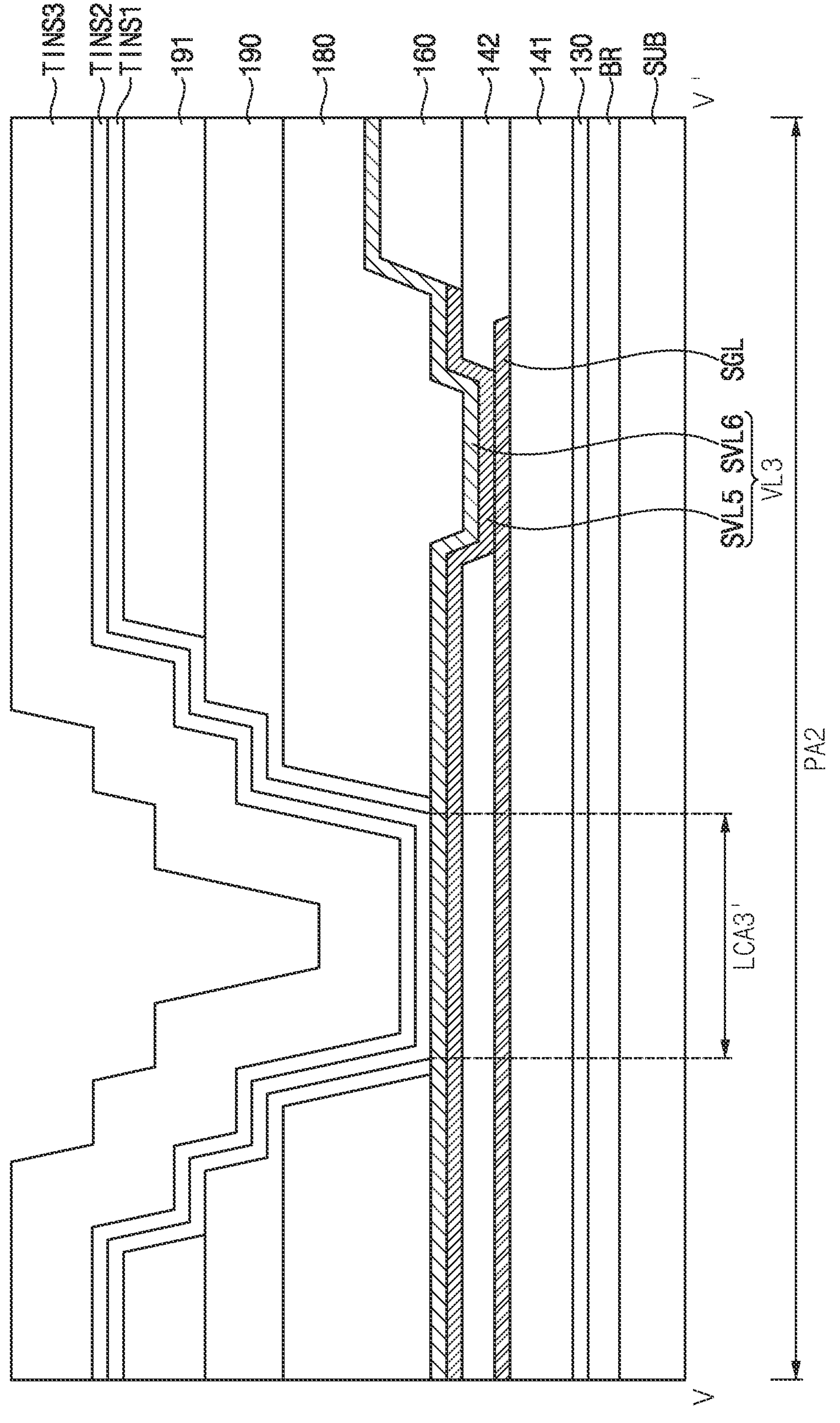
FIG. 12 is a cross-sectional view taken along line V-V of FIG. 11.

FIG. 12 is a cross-sectional view taken along line V-V of FIG. 11.

Referring further to FIG. 12, in an embodiment, the third power line VL3 may include a fifth sub power line SVL5 and a sixth sub power line SVL6.

The fifth sub power line SVL5 may be disposed on the second interlayer insulating layer 142. That is, the fifth sub power line SVL5 may include or be formed of a same material as the first anode connection electrode (ANDE1 in FIG. 4) and disposed in (or directly on) a same layer as the first anode connection electrode ANDE1. In an embodiment, for example, the fifth sub power line SVL5 may include a conductive material such as metal, alloy, conductive metal oxide, conductive metal nitride, transparent conductive material, or the like.

The sixth sub power line SVL6 may be disposed on the fifth sub power line SVL5 and the first planarization layer 160. That is. the sixth sub power line SVL6 may include or be formed of a same material as the second anode connection electrode (ANDE2 in FIG. 4) and may be disposed in (or directly on) a same layer as the second anode connection electrode ANDE2. In an embodiment, for example, the sixth sub power line SVL6 may include a conductive material such as metal, alloy, conductive metal oxide, conductive metal nitride, transparent conductive material, or the like.

As shown in FIG. 12, in the second peripheral area PA2, the second planarization layer 180, the pixel defining layer 190, and the spacer 191 may expose a portion of the third power line VL3. Accordingly, the first touch insulating layer TINS1 may contact the third power line VL3 exposed from the second planarization layer 180, the pixel defining layer 190, and the spacer 191.

In an embodiment, as shown in FIG. 11, the second peripheral area PA2 may include a first line contact area LCA1', a second line contact area LCA2', and a third line contact area LCA3'.

The first line contact area LCA1' and the second line contact area LCA2' may be substantially the same as the first line contact area LCA1 and the second line contact area LCA2 described with reference to FIG. 5. Therefore, any repetitive detailed description thereof will be omitted.

The third line contact area LCA' may be positioned in the first direction DR1 from the first line contact area LACI' in a plan view. That is, the third line contact area LCA3' may be positioned below the first line contact area LCA1'. In an embodiment, a portion of the third power line VL3 may be disposed in the third line contact area LCA3'. That is, as shown in FIG. 12, the first touch insulating layer TINS1 may contact the third power line VL3 in the third line contact area LCA3'.

The third line contact area LCA3' may extend in the second direction DR2. In an embodiment, for example, the first line contact area LCA1' and the third line contact area LCA3' may be spaced apart from each other in the first direction DR1 and may extend parallel to each other in the second direction DR2. Accordingly, air or moisture introduced from outside may be double-blocked. In an embodiment, for example, air or moisture introduced in the first direction DR1 may be primarily blocked by a moisture barrier structure formed in the first and second line contact areas LCA1' and LCA2' and may be secondarily blocked by a moisture barrier structure formed in the third line contact area LCA3'. Accordingly, durability of the display device DD may be further improved.

In an embodiment, as shown in FIG. 11, the second peripheral area PA2 may further include a fourth line contact area LAC4'. The fourth line contact area LCA4' may be spaced apart from the first line contact area LCA1' and the second line contact area LCA2' in a plan view. In an embodiment, the fourth line contact area LCA4' may be spaced apart from the second line contact area LCA2' with the first line contact area LCA1' interposed therebetween. That is, the fourth line contact area LCA4' may be positioned closer to the center of the second peripheral area than the first line contact area LCA1' and the second line contact area LCA2'. The third line contact area LCA3' may be positioned in the first direction DR1 from the fourth line contact area LCA4'. That is, the fourth line contact area LCA4' may be positioned above the third line contact area LCA3.

A portion of the third power line VL3 may be disposed in the fourth line contact area LCA4'. That is, although not shown, the first touch insulating layer TINS1 may contact the third power line VL3 in the fourth line contact area LCA4' as well. Accordingly, a moisture barrier structure in which an inorganic layer and a conductive layer contact each other may be formed even in the fourth line contact area LCA4'. Accordingly, permeation of external air or moisture may be more effectively delayed or effectively prevented. Accordingly, durability of the display device DD may be further improved.

In an embodiment, as shown in FIG. 11, the second peripheral area PA2 may further include an inorganic contact area ICA'. The inorganic contact area ICA' may be substantially the same as the inorganic contact area ICA described with reference to FIG. 5. Therefore, any repetitive detailed description thereof will be omitted.

Figure 13:
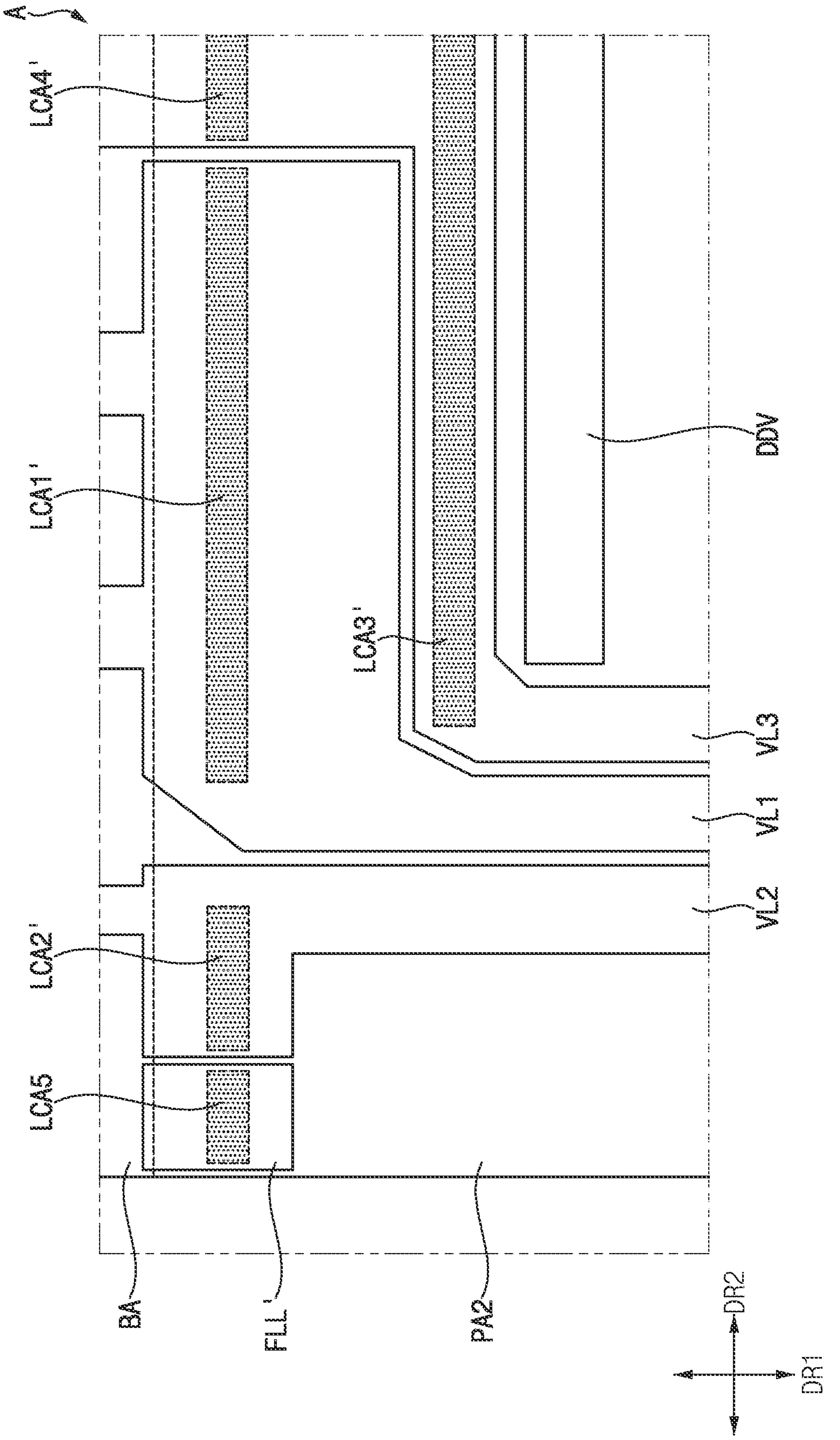
FIG. 13 is an enlarged view illustrating still another alternative embodiment of area A of FIG. 1.

FIG. 13 is an enlarged view illustrating still another alternative embodiment of area A of FIG. 1.

Referring to FIG. 13, area A shown in FIG. 13 may be substantially the same as area A described with reference to FIG. 11 except for a floating line FLL' and a fifth line contact area LCA5. Therefore, any repetitive detailed descriptions of the same or like elements as those of FIG. 12 will be omitted.

In an embodiment, the display device DD may further include a floating line FLL'. The floating line FLL' may be substantially the same as the floating line FLL described with reference to FIG. 10. Therefore, any repetitive detailed descriptions thereof will be omitted.

In an embodiment, the second peripheral area PA2 may further include the fifth line contact area LCA5. The fifth line contact area LCA5 may be substantially same as the fourth line contact area LCA4 described with reference to FIG. 10. Therefore, any repetitive detailed descriptions thereof will be omitted. That is, although not shown, the first touch insulating layer (TINS1 in FIG. 12) may contact the floating line FFL' in the fifth line contact area LCA5. Accordingly, a moisture barrier structure in which an inorganic layer and a conductive layer contact each other may be formed in the fifth line contact area LCA5 as well. Accordingly, permeation of external air or moisture may be more effectively delayed or effectively prevented. Accordingly, durability of the display device DD may be further improved.

According to embodiments, the display device DD may include power lines disposed in the second peripheral area PA2 below the bending area BA and a touch insulating layer contacting the power lines in the second peripheral area PA2. In such embodiments, line contact areas, which are areas where the touch insulating layer contacts the power lines, may be defined in the second peripheral area PA2. Accordingly, a moisture barrier structure in which an inorganic layer and a conductive layer contact each other may be formed in the line contact areas. Accordingly, permeation of external air or moisture may be effectively delayed or effectively prevented by the moisture barrier structure. Accordingly, durability of the display device DD may be improved.

In such embodiments, since the moisture barrier structure is formed by contact between the power lines and the touch insulating layer, a size of each of the line contact areas may be wider, and a degree of freedom of a position of the moisture barrier structure may be improved. Accordingly, a position of each of the line contact areas where the moisture barrier structure is formed may be more variously determined according to the embodiments. Accordingly, permeation of external air or moisture may be more effectively delayed or effectively prevented.

In addition, according to embodiments, compared to a case where the moisture barrier structure is formed by contact between the touch insulating layer and a structure under the power lines, the power lines may have a large size (e.g., planar area) even when the moisture barrier structure is formed. Accordingly, the moisture barrier structure may be formed without deteriorating a resistance characteristic of each of the power lines.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a substrate including a display area, a first peripheral area surrounding the display area, a second peripheral area positioned in a first direction from the display area, and a bending area positioned between the first peripheral area and the second peripheral area;

a first power line disposed in the second peripheral area on the substrate, wherein the first power line receives a first power voltage;

a second power line disposed in the second peripheral area on the substrate, positioned farther from a center of the second peripheral area than the first power line, wherein the second power line receives a second power voltage; and a sensing layer disposed on the substrate, wherein the sensing layer includes a touch electrode and a touch insulating layer contacting the first power line and the second power line in the second peripheral area, wherein the second peripheral area includes:

a first line contact area extending in a second direction perpendicular to the first direction in a plan view, wherein at least a portion of the first power line is disposed in the first line contact area; and a second line contact area spaced apart from the first line contact area in the plan view, and positioned farther from the center of the second peripheral area than the first line contact area, wherein at least a portion of the second power line is disposed in the second line contact area, and the touch insulating layer contacts the first power line in the first line contact area and contacts the second power line in the second line contact area.

2. The display device of claim 1, wherein the second peripheral area further includes:

a third line contact area extending in the first direction in the plan view, and spaced apart from the first line contact area and the second line contact area, wherein at least a portion of the first power line or at least a portion of the second power line is disposed in the third line contact area, and the touch insulating layer contacts the first power line or the second power line in the third line contact area.

3. The display device of claim 2, further comprising:

a data driver disposed in the second peripheral area on the substrate, positioned in the first direction from the first line contact area, and positioned in the second direction from the third line contact area.

4. The display device of claim 1, further comprising:

an interlayer insulating layer disposed in the display area, the first peripheral area, the second peripheral area, and the bending area on the substrate, and disposed under the first power line and the second power line, and wherein the touch insulating layer further contacts the interlayer insulating layer in the second peripheral area.

5. The display device of claim 4, wherein the second peripheral area further includes:

an inorganic contact area spaced apart from the first line contact area and the second line contact area in the plan view, and spaced apart from the first line contact area with the second line contact area interposed therebetween, wherein at least a portion of the interlayer insulating layer is exposed from the first power line and the second power line in the inorganic contact area, and the touch insulating layer contacts the interlayer insulating layer in the inorganic contact area.

6. The display device of claim 1, further comprising:

an interlayer insulating layer disposed in the display area, the first peripheral area, the second peripheral area, and the bending area on the substrate, and disposed under the first power line and the second power line; and a floating line disposed in the second peripheral area on the interlayer insulating layer, and positioned farther from the center of the second peripheral area than the second power line, wherein the floating lines includes a same material as the second power line, and wherein the touch insulating layer further contacts the floating line in the second peripheral area.

7. The display device of claim 6, wherein the second peripheral area further includes:

a fourth line contact area spaced apart from the first line contact area and the second line contact area in the plan view, and spaced apart from the first line contact area with the second line contact area interposed therebetween, wherein at least a portion of the floating line is disposed in the fourth line contact area, and the touch insulating layer contacts the floating line in the fourth line contact area.

8. The display device of claim 1, wherein the first power line and the second power line include a conductive material, and the touch insulating layer includes an inorganic material.

9. The display device of claim 1, wherein the first power voltage has a higher potential than the second power voltage.

10. A display device comprising:

a substrate including a display area, a first peripheral area surrounding the display area, a second peripheral area positioned in a first direction from the display area, and a bending area positioned between the first peripheral area and the second peripheral area;

a first power line disposed in the second peripheral area on the substrate, wherein the first power line receives a first power voltage;

a second power line disposed in the second peripheral area on the substrate, and positioned farther from a center of the second peripheral area than the first power line, wherein the second power line receives a second power voltage;

a third power line disposed in the second peripheral area on the substrate, and positioned closer to the center of the second peripheral area than the first power line, wherein the third power line receives the second power voltage; and a sensing layer disposed on the substrate, wherein the sensing layer includes a touch electrode and a touch insulating layer contacting the first power line, the second power line, and the third power line in the second peripheral area.

11. The display device of claim 10, wherein the second peripheral area includes:

a first line contact area extending in a second direction perpendicular to the first direction in a plan view, wherein at least a portion of the first power line is disposed in the first line contact area;

a second line contact area spaced apart from the first line contact area in the plan view, and positioned farther from the center of the second peripheral area than the first line contact area, wherein at least a portion of the second power line is disposed in the second line contact area; and a third line contact area positioned in the first direction from the first line contact area in the plan view, and extending in the second direction, wherein at least a portion of the third power line is disposed in the third line contact area, and the touch insulating layer contacts the first power line in the first line contact area, contacts the second power line in the second line contact area, and contacts the third power line in the third line contact area.

12. The display device of claim 11, further comprising:

a data driver disposed in the second peripheral area on the substrate and positioned in the first direction from the third line contact area, and wherein the third line contact area is positioned between the first line contact area and the data driver in the plan view.

13. The display device of claim 11, wherein the second peripheral area further includes:

a fourth line contact area spaced apart from the first line contact area and the second line contact area in the plan view, and spaced apart from the second line contact area with the first line contact area interposed therebetween, wherein at least a portion of the third line is disposed in the fourth line contact area, and the touch insulating layer contacts the third power line in the fourth line contact area as well.

14. The display device of claim 11, further comprising:

an interlayer insulating layer disposed in the display area, the first peripheral area, the second peripheral area, and the bending area on the substrate, and disposed under the first power line and the second power line, and wherein the touch insulating layer further contacts the interlayer insulating layer in the second peripheral area.

15. The display device of claim 14, wherein the second peripheral area further includes:

an inorganic contact area spaced apart from the first line contact area and the second line contact area in the plan view, and spaced apart from the first line contact area with the second line contact area interposed therebetween, wherein at least a portion of the interlayer insulating layer is exposed from the first power line, the second power line, and the third power line in the inorganic contact area, and the touch insulating layer contacts the interlayer insulating layer in the inorganic contact area.

16. The display device of claim 11, further comprising:

an interlayer insulating layer disposed in the display area, the first peripheral area, the second peripheral area, and the bending area on the substrate, and disposed under the first power line and the second power line; and a floating line disposed in the second peripheral area on the interlayer insulating layer, and positioned farther from the center of the second peripheral area than the second power line, wherein the floating line includes a same material as the second power line, and wherein the touch insulating layer further contacts the floating line in the second peripheral area.

17. The display device of claim 16, wherein the second peripheral area further includes:

a fifth line contact area spaced apart from the first line contact area and the second line contact area in the plan view, and spaced apart from the first line contact area with the second line contact area interposed therebetween, wherein at least a portion of the floating line is disposed in the fifth line contact area, and the touch insulating layer contacts the floating line in the fifth line contact area.

18. The display device of claim 10, wherein the first power line, the second power line, and the third power line include a conductive material, and the touch insulating layer includes an inorganic material.

19. The display device of claim 10, wherein the first power voltage has a higher potential than the second power voltage.

* * * * *